(12) United States Patent
Yamazaki

(10) Patent No.: US 10,199,393 B2
(45) Date of Patent: *Feb. 5, 2019

(54) DISPLAY DEVICE AND METHOD FOR MANUFACTURING DISPLAY DEVICE

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/804,376

(22) Filed: Nov. 6, 2017

(65) Prior Publication Data

US 2018/0122831 A1    May 3, 2018

Related U.S. Application Data

(63) Continuation of application No. 14/324,651, filed on Jul. 7, 2014, now Pat. No. 9,818,763.

(30) Foreign Application Priority Data

Jul. 12, 2013   (JP) .................................. 2013-146046

(51) Int. Cl.
  *H01L 27/32*   (2006.01)
  *H01L 27/14*   (2006.01)
  (Continued)

(52) U.S. Cl.
  CPC ...... *H01L 27/1218* (2013.01); *H01L 27/1225* (2013.01); *H01L 27/1255* (2013.01);
  (Continued)

(58) Field of Classification Search
  CPC ............ H01L 27/1225; H01L 27/1255; H01L 27/1266; H01L 27/1218; H01L 27/3258; H01L 29/78603; H01L 29/7869
  (Continued)

(56) References Cited

U.S. PATENT DOCUMENTS 5,731,856 A   3/1998   Kim et al.
5,744,864 A   4/1998   Cillessen et al.
(Continued)

FOREIGN PATENT DOCUMENTS

EP   1737044 A   12/2006
EP   1793366 A   6/2007
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Dao H Nguyen
(74) *Attorney, Agent, or Firm* — Robinson Intellectual Property Law Office; Eric J. Robinson

(57) ABSTRACT

A highly flexible display device and a method for manufacturing the display device are provided. A transistor including a light-transmitting semiconductor film, a capacitor including a first electrode, a second electrode, and a dielectric film between the first electrode and the second electrode, and a first insulating film covering the semiconductor film are formed over a flexible substrate. The capacitor includes a region where the first electrode and the dielectric film are in contact with each other, and the first insulating film does not cover the region.

17 Claims, 24 Drawing Sheets

(51) Int. Cl.
*H01L 33/40* (2010.01)
*H01L 27/12* (2006.01)
*H01L 29/786* (2006.01)

(52) U.S. Cl.
CPC ...... *H01L 27/1266* (2013.01); *H01L 29/7869* (2013.01); *H01L 29/78603* (2013.01)

(58) Field of Classification Search
USPC ......... 257/40, 43, 59, 66, E29.063, E29.068, 257/E33.053, E33.063, E51.018; 438/23, 438/104, 158
See application file for complete search history.

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,388,225 | B2 | 6/2008 | Fukuhara et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,994,502 | B2 | 8/2011 | Yamazaki et al. |
| 8,102,476 | B2 | 1/2012 | Son et al. |
| 8,134,151 | B2 | 3/2012 | Imai |
| 8,325,111 | B2 | 12/2012 | Kimura |
| 8,367,440 | B2 | 2/2013 | Takayama et al. |
| 8,378,343 | B2 | 2/2013 | Yamazaki et al. |
| 8,415,208 | B2 | 4/2013 | Takayama et al. |
| 8,558,236 | B2 | 10/2013 | Yamazaki et al. |
| 8,685,803 | B2 | 4/2014 | Chikama et al. |
| 8,890,180 | B2 | 11/2014 | Kimura |
| 9,105,593 | B2 * | 8/2015 | Jin .................... H01L 27/3276 |
| 9,105,864 | B2 | 8/2015 | Choi |
| 9,818,763 | B2 * | 11/2017 | Yamazaki ........... H01L 27/1218 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091399 | A1 | 5/2006 | Lee |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0078666 | A1 | 4/2010 | Mochiku |
| 2010/0092800 | A1 | 4/2010 | Itagaki et al. |
| 2010/0109002 | A1 | 5/2010 | Itagaki et al. |
| 2010/0163874 | A1 | 7/2010 | Koyama et al. |
| 2011/0031493 | A1 * | 2/2011 | Yamazaki ........... H01L 27/1214 257/43 |
| 2011/0032435 | A1 | 2/2011 | Kimura |
| 2011/0084271 | A1 | 4/2011 | Yamazaki et al. |
| 2012/0156834 | A1 * | 6/2012 | Chou .................. H01L 27/1288 438/158 |
| 2012/0248451 | A1 | 10/2012 | Sone et al. |
| 2013/0214324 | A1 | 8/2013 | Takayama et al. |
| 2014/0014948 | A1 | 1/2014 | Matsukura |
| 2014/0209897 | A1 | 7/2014 | Kubota et al. |
| 2014/0241487 | A1 | 8/2014 | Yamazaki et al. |
| 2014/0306219 | A1 | 10/2014 | Yamazaki et al. |
| 2014/0312342 | A1 | 10/2014 | Yamazaki |
| 2014/0339539 | A1 | 11/2014 | Yamazaki et al. |
| 2015/0001492 | A1 | 1/2015 | Lee |
| 2015/0102351 | A1 | 4/2015 | Kimura |
| 2015/0144946 | A1 * | 5/2015 | Kusunoki ......... G02F 1/133621 257/43 |
| 2016/0204180 | A1 | 7/2016 | Lee et al. |

FOREIGN PATENT DOCUMENTS

| | | |
|---|---|---|
| EP | 2157615 A | 2/2010 |
| EP | 2226847 A | 9/2010 |
| EP | 2511896 A | 10/2012 |
| JP | 60-198861 A | 10/1985 |
| JP | 63-210022 A | 8/1988 |

(56) References Cited

FOREIGN PATENT DOCUMENTS

| | | |
|---|---|---|
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-104312 A | 4/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-174153 A | 6/2003 |
| JP | 2004-103957 A | 4/2004 |
| JP | 2004-273614 A | 9/2004 |
| JP | 2004-273732 A | 9/2004 |
| JP | 2005-077822 A | 3/2005 |
| JP | 2007-035839 A | 2/2007 |
| JP | 2009-177138 A | 8/2009 |
| JP | 2010-074138 A | 4/2010 |
| JP | 2012-134520 A | 7/2012 |
| JP | 2012-141627 A | 7/2012 |
| JP | 2013-051421 A | 3/2013 |
| WO | WO-2004/114391 | 12/2004 |
| WO | WO-2011/007675 | 1/2011 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Backplane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:the "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase". Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07: SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 3;9, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

(56) References Cited

OTHER PUBLICATIONS

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193,
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara,H et al., "Amorphous In—Ga—Zn-Oxide TFTs with Suppressed Variation for 4.0 inch QVGAQ AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al, "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Displaly Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

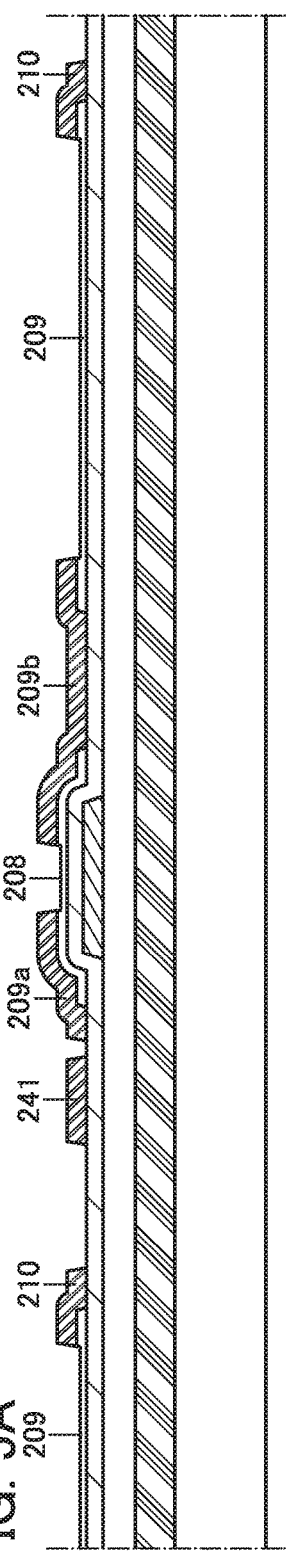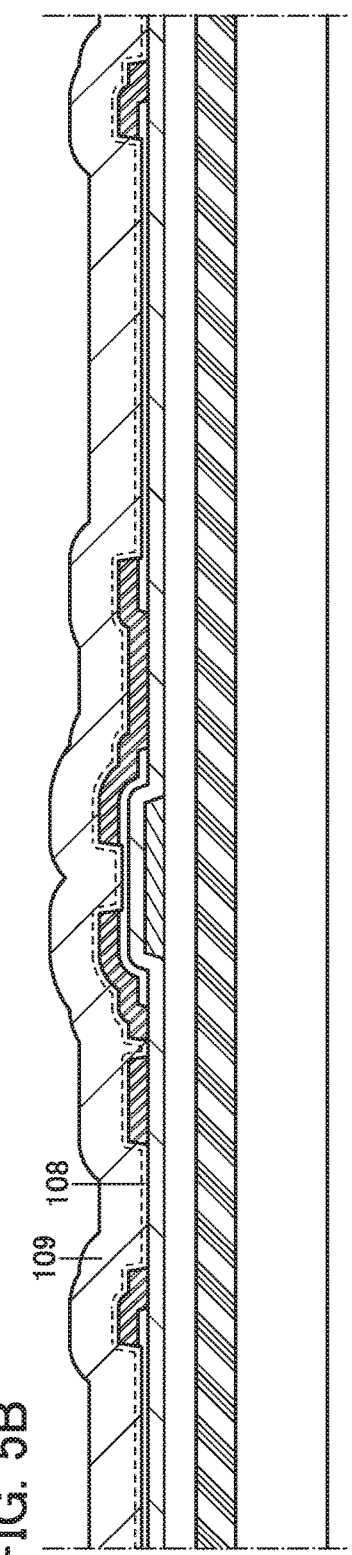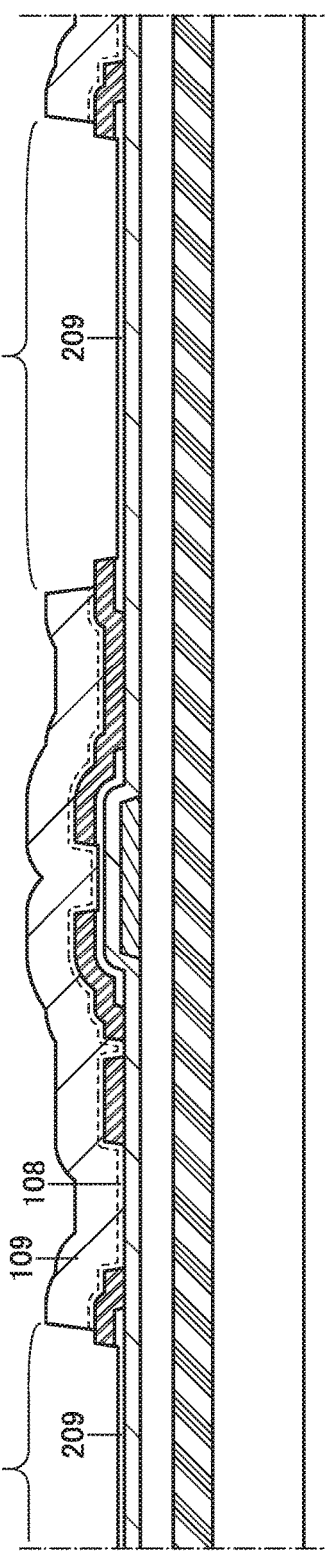

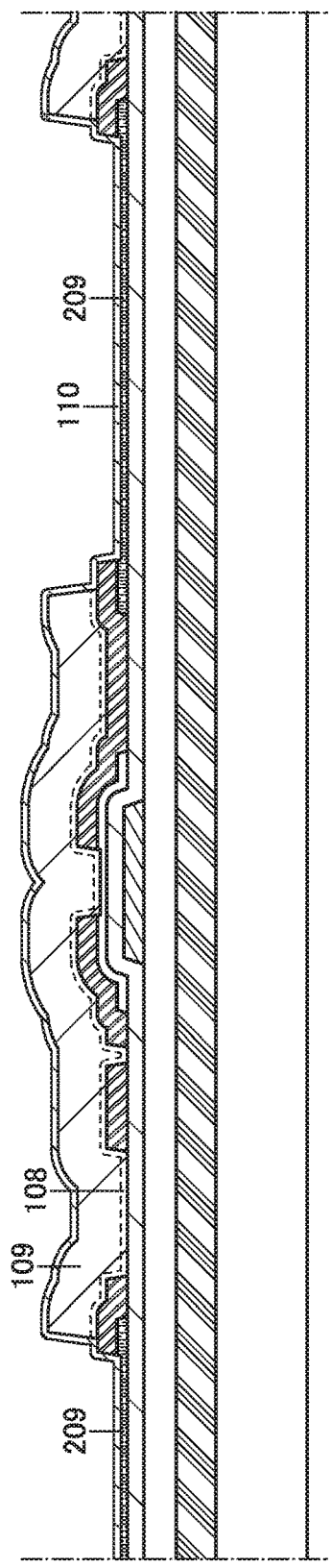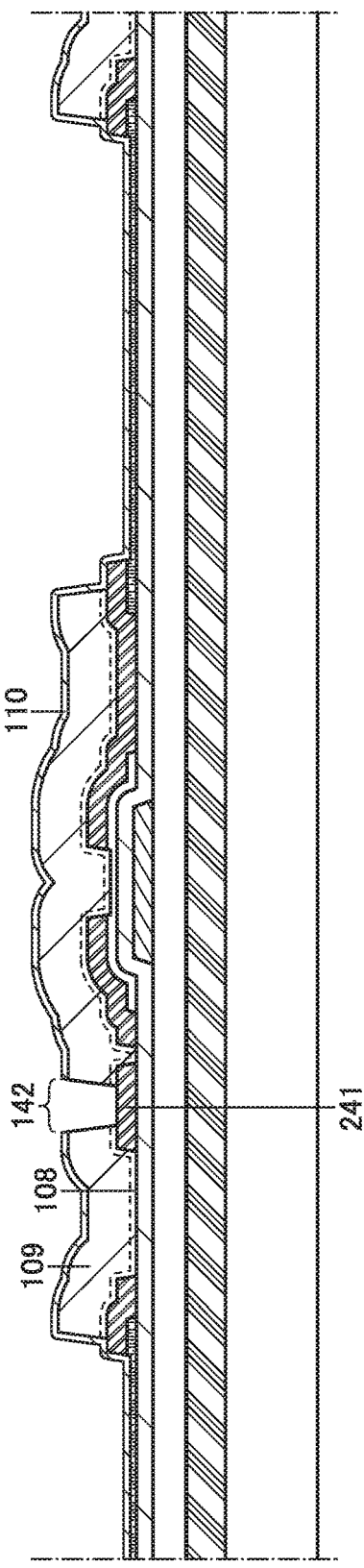

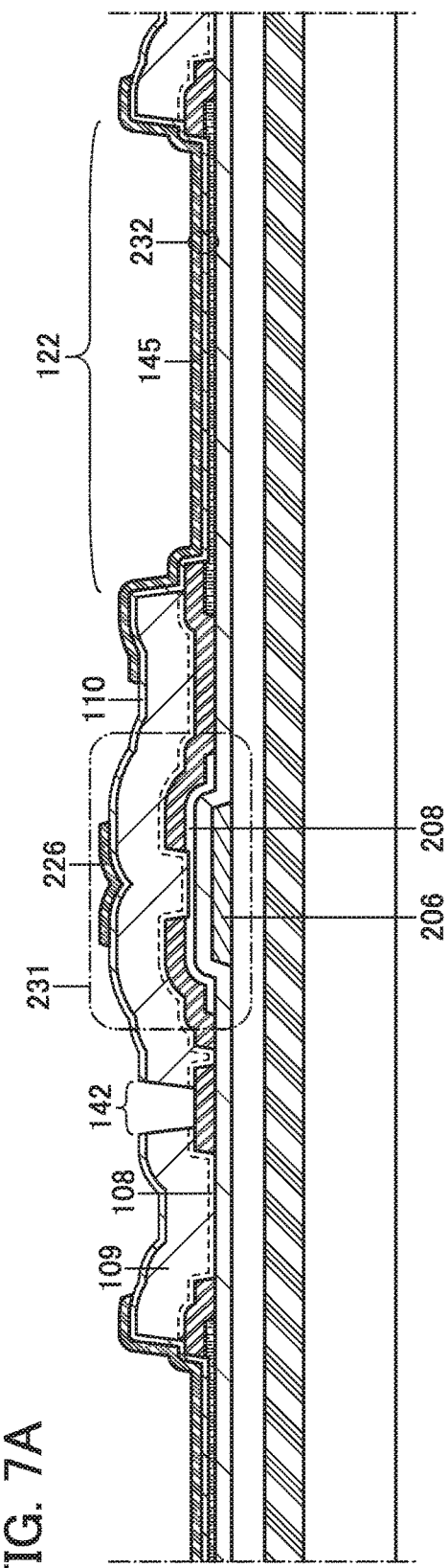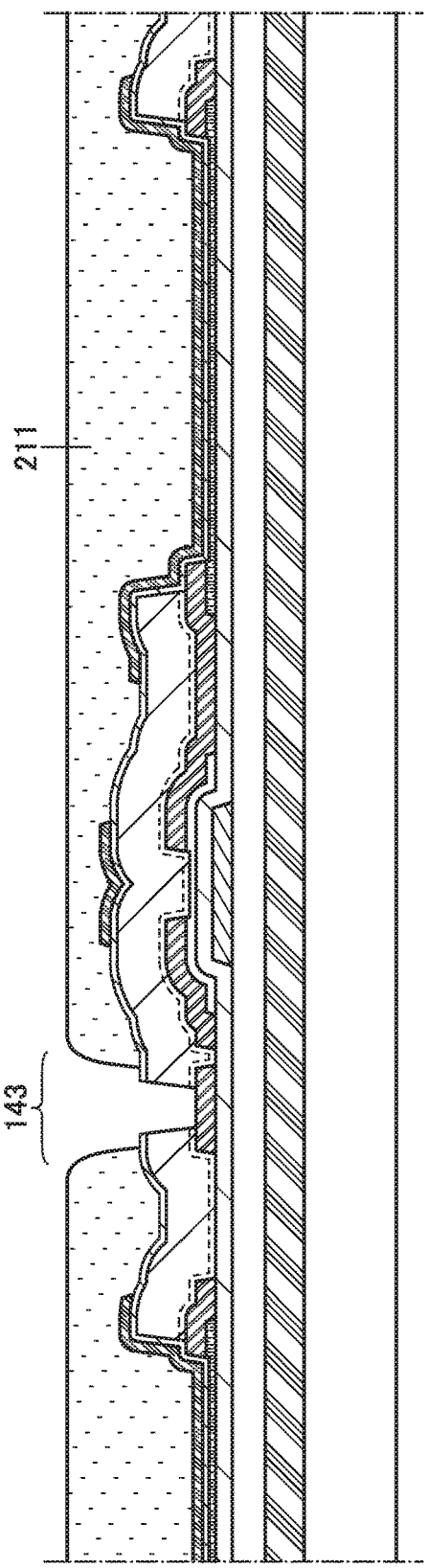

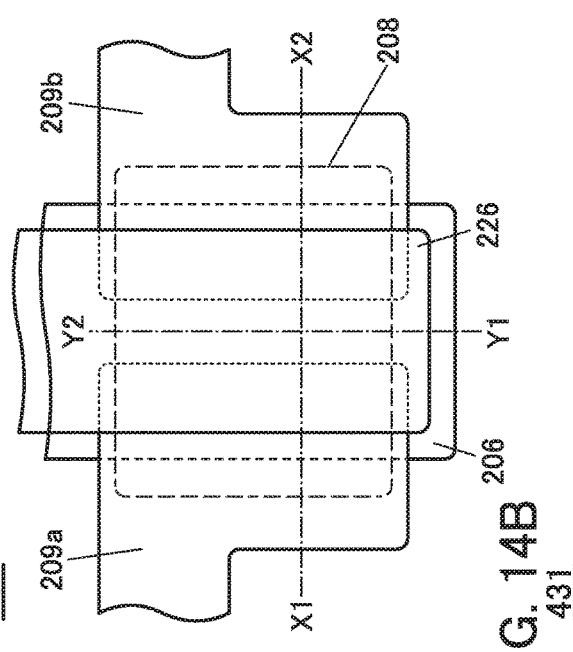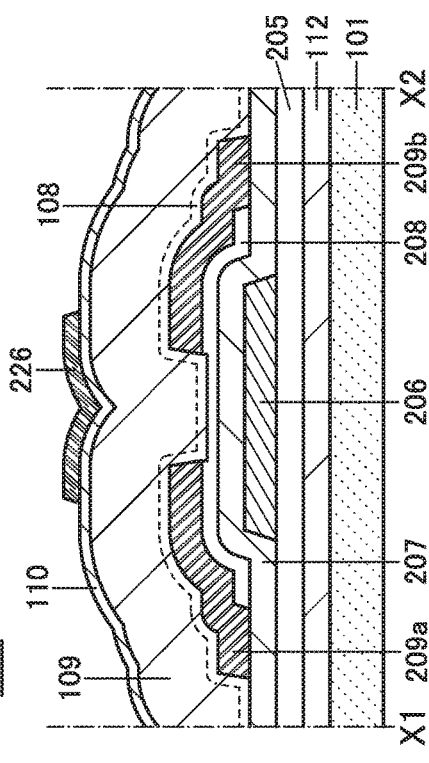

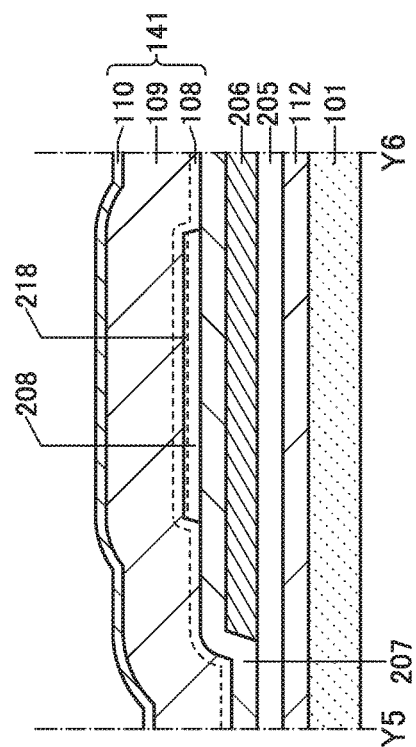
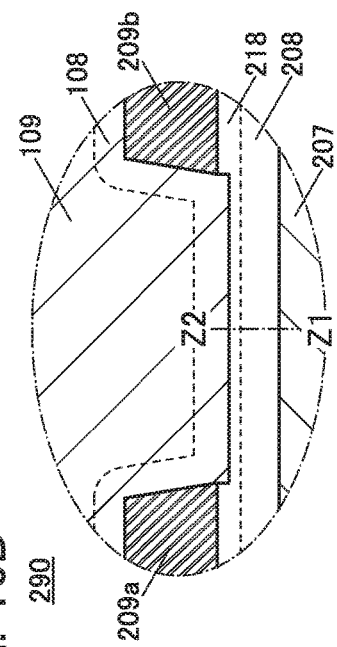
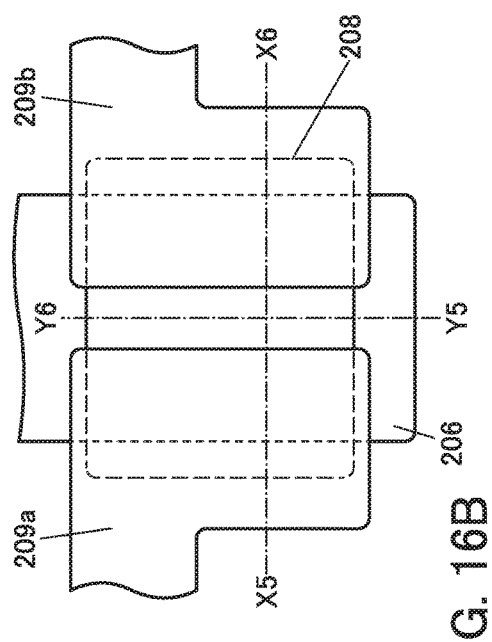
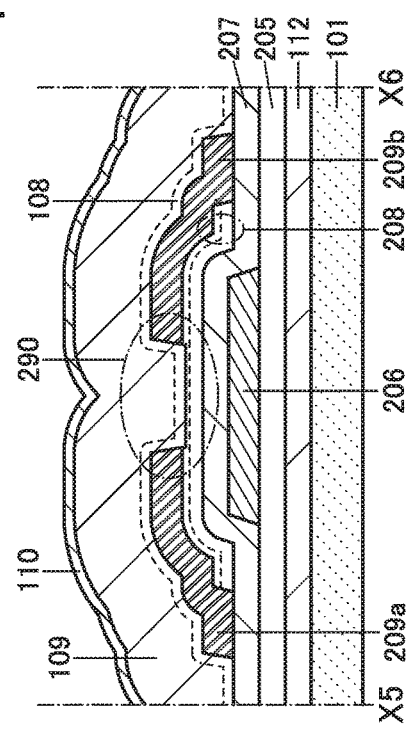
FIG. 16A 250
FIG. 16B 250
FIG. 16C 250
FIG. 16D 290

DISPLAY DEVICE AND METHOD FOR MANUFACTURING DISPLAY DEVICE

BACKGROUND OF THE INVENTION

1. Field of the Invention

The present invention relates to an object, a method, or a manufacturing method. In addition, the present invention relates to a process, a machine, manufacture, or a composition of matter. One embodiment of the present invention particularly relates to a semiconductor device, a light-emitting device, a display device, or a manufacturing method thereof.

In this specification and the like, the term "semiconductor device" means all devices winch can operate by utilizing semiconductor characteristics. For example, an electro-optical device, a display device, a light-emitting device, a semiconductor circuit, a transistor, and an electronic device may include a semiconductor device.

2. Description of the Related Art

In recent years, display devices such as a liquid crystal display device including a liquid crystal element as a display element and a light-emitting display device including an organic electroluminescent (EL) element (also referred to as an organic light-emitting diode, OLED, or the like) as a display element have been widely used. In order that these display devices have flexibility, the use of a flexible substrate in the display devices has been examined.

As a method for manufacturing a display device using a flexible substrate, a technique has been developed in which a semiconductor element such as a thin film transistor is manufactured over a substrate such as a glass substrate or a quartz substrate, for example, a space between the semiconductor element and another substrate is filled with an organic resin, and then the semiconductor element is transferred from the glass substrate or the quartz substrate to the other substrate (e.g., a flexible substrate) (Patent Document 1).

PATENT DOCUMENT

[Patent Document 1] Japanese Published Patent Application No. 2003-174153

SUMMARY OF THE INVENTION

An object of one embodiment of the present invention is to provide a highly flexible display device and a method for manufacturing the same. Another object of one embodiment of the present invention is to provide a non-breakable display device and a method for manufacturing the same. Another object of one embodiment of the present invention is to provide a lightweight display device and a method for manufacturing the same. Another object of one embodiment of the present invention is to provide an easily bendable display device and a method for manufacturing the same.

Another object of one embodiment of the present invention is to provide a highly reliable display device and a method for manufacturing the same.

Another object of one embodiment of the present invention is to provide a novel display device and a method for manufacturing the same. Note that the descriptions of these objects do not disturb the existence of other objects. Note that in one embodiment of the present invention, there is no need to achieve all the objects. Note that other objects will be apparent from the description of the specification, the drawings, the claims, and the like and other objects can be derived from the description of the specification, the drawings, the claims, and the like.

One embodiment of the present invention is a display device including, over a flexible substrate, a transistor which includes a light-transmitting semiconductor film, a capacitor which includes a first electrode, a second electrode, and a dielectric film between the first electrode and the second electrode, and an insulating film which covers the semiconductor film. The capacitor includes a region where the first electrode and the dielectric film are in contact with each other. The insulating film does not cover the region.

One embodiment of the present invention is a display device including, over a flexible substrate, a transistor which includes a light-transmitting semiconductor film, a capacitor which includes a first electrode, a second electrode, and a dielectric film between the first electrode and the second electrode, a light-emitting element, and a first insulating film which covers the semiconductor film. The capacitor includes a region where the first electrode and the dielectric film are in contact with each other. The first insulating film does not cover the region.

The first electrode is provided on the same surface as the semiconductor film. The light-emitting element is capable of emitting white light, for example. A coloring layer may be provided so as to overlap with the light-emitting element.

The display device may have a top-emission structure, a bottom-emission structure, or a dual-emission structure.

The display device is easily bendable. One embodiment of the present invention can provide a highly reliable display device which is not easily broken even when a bending operation is repeated.

One embodiment of the present invention can provide a highly flexible display device and a method for manufacturing the same.

One embodiment of the present invention can provide a highly reliable display device and a method for manufacturing the same.

One embodiment of the present invention can provide a novel display device and a method for manufacturing the same.

BRIEF DESCRIPTION OF THE DRAWINGS

FIGS. 5A to 5C are cross-sectional views illustrating one embodiment of a method for manufacturing a display device.

FIGS. 6A and 6B are cross-sectional views illustrating one embodiment of a method for manufacturing a display device.

FIGS. 7A and 7B are cross-sectional views illustrating one embodiment of a method for manufacturing a display device.

FIGS. 14A to 14C illustrate one embodiment of a transistor.

FIGS. 16A to 16B illustrate one embodiment of a transistor.

DETAILED DESCRIPTION OF THE INVENTION

Figure 1A:
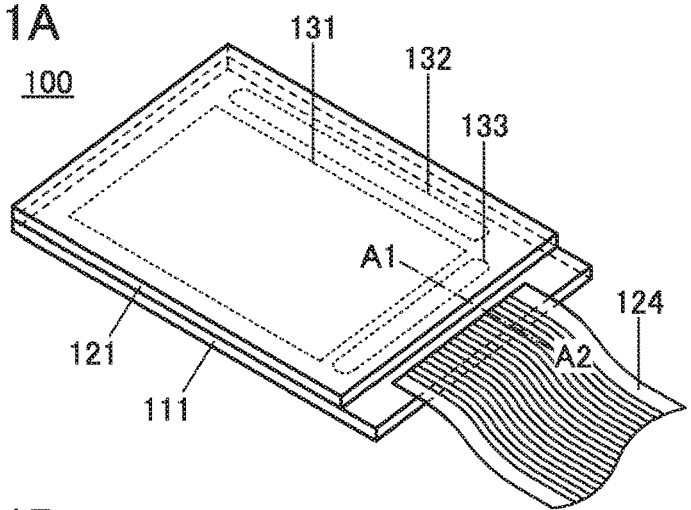
FIGS. 1A to 1C are perspective views illustrating one embodiment of a display device.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

Note that in each drawing referred to in this specification, the size of each component or the thickness of each layer might be exaggerated or a region might be omitted for clarity of the invention. Therefore, embodiments of the invention are not limited to such scales. Especially in a top view, some components might not be illustrated for easy understanding.

The position, size, range, and the like of each component illustrated in the drawings and the like are not accurately represented in some cases to facilitate understanding of the invention. Therefore, the disclosed invention is not necessarily limited to the position, size, range, and the like disclosed in the drawings and the like. For example, in the actual manufacturing process, a resist mask or the like might be unintentionally reduced in size by treatment such as etching, which is not illustrated in some cases for easy understanding.

Especially in a top view (also referred to as a plan view), some components might not be illustrated for easy understanding.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components.

In addition, in this specification and the like, the term such as an "electrode" or a "wiring" does not limit a function of a component. For example, an "electrode" is used as part of a "wiring" in some cases, and vice versa. Further, the term "electrode" or "wiring" can also mean a combination of a plurality of "electrodes" and "wirings" formed in an integrated manner.

Note that the term "over" or "under" in this specification and the like does not necessarily mean that a component is placed "directly above and in contact with" or "directly below and in contact with" another component. For example, the expression "electrode B over insulating layer A" does not necessarily mean that the electrode B is on and in direct contact with the insulating layer A and can mean the case where another component is provided between the insulating layer A and the electrode B.

Further, functions of a source and a drain might be switched depending on operation conditions, e.g., when a transistor having a different polarity is employed or a direction of current flow is changed in circuit operation. Therefore, it is difficult to define which is the source (or the drain). Thus, the terms "source" and "drain" can be used to denote the drain and the source, respectively.

In this specification and the like, the term "electrically connected" includes the case where components are connected through an object having any electric function. There is no particular limitation on an "object having any electric function" as long as electric signals can be transmitted and received between components that are connected through the object. Thus, even when the expression "electrically connected" is used in this specification, there is a case in which no physical connection is made and a wiring is just extended in an actual circuit.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°.

In this specification, in the case where an etching step is performed after a photolithography process, a resist mask formed in the photolithography process is removed after the etching step, unless otherwise specified.

Embodiment 1

Figure 1B:
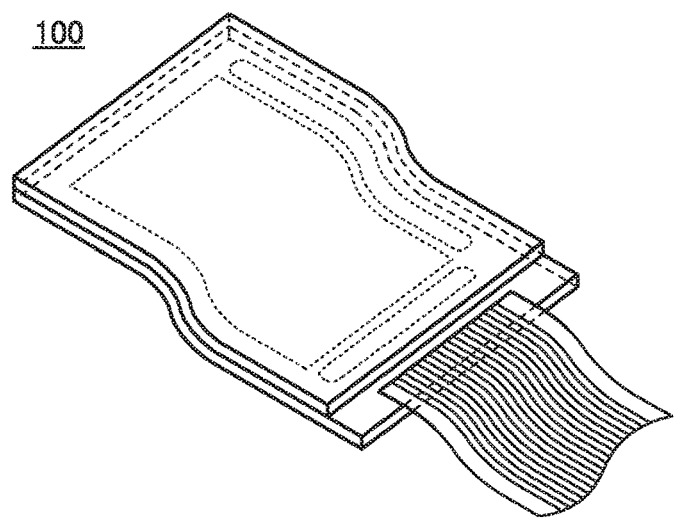
Figure 1C:
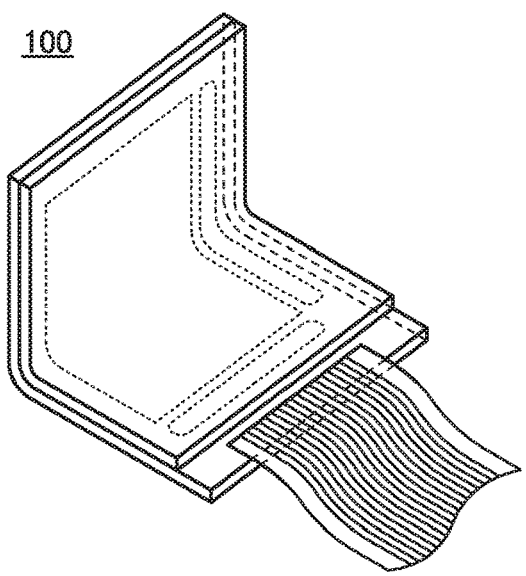
Figure 2:
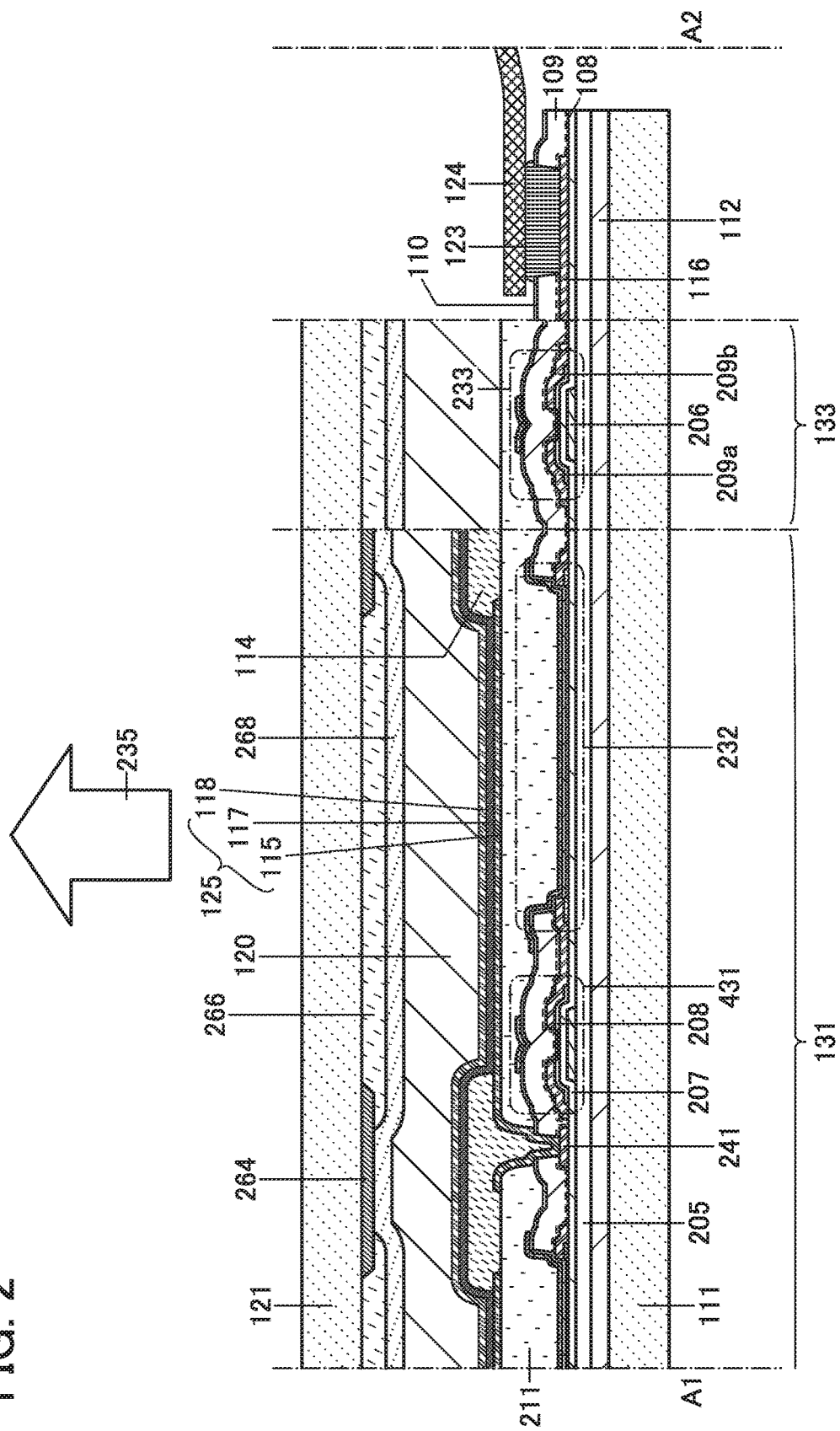
FIG. 2 is a cross-sectional view illustrating one embodiment of a display device.

In this embodiment, a semiconductor device which is one embodiment of the present invention and a manufacturing method thereof are described with reference to drawings. FIG. 1A is a perspective view of a display device 100. The display device 100 described in this embodiment as an example is a light-emitting display device in which a light-emitting element is used as a display element. The display device 100 described in this embodiment as an example has flexibility and can be bent freely as illustrated in FIGS. 1B and 1C. FIG. 2 is a cross-sectional view of a portion taken along a dashed-dotted line A1-A2 in FIG. 1A.

<Structure of Display Device>

The display device 100 described in this embodiment as an example includes a display area 131, a first driver circuit 132, and a second driver circuit 133. The display area 131, the first driver circuit 132, and the second driver circuit 133 include a plurality of transistors. For example, the second driver circuit 133 includes a plurality of transistors 233. The display device 100 also includes a terminal electrode 116 and a light-emitting element 125 including an electrode 115, an EL layer 117, and an electrode 118. A plurality of light-emitting elements 125 are formed in the display area 131. A transistor 231 (not illustrated) for controlling the amount of light emitted from the light-emitting element 125 is electrically connected to each of the light-emitting elements 125. A capacitor 232 is electrically connected to the transistor 231. In addition, a transistor 431 capable of supplying a data signal is electrically connected to the transistor 231.

The first driver circuit 132 and the second driver circuit 133 each have a function of supplying a signal from an external electrode 124 to a specific one of the light-emitting elements 125 in the display area 131 at a specific timing.

In the display device 100, a substrate 111 and a substrate 121 are attached to each other with a bonding layer 120 provided therebetween. An insulating film 205 is formed over the substrate 111 with a bonding layer 112 provided therebetween. The insulating film 205 is preferably formed as a single layer or a multilayer using silicon oxide, silicon nitride, silicon oxynitride, silicon nitride oxide, aluminum oxide, aluminum oxynitride, aluminum nitride oxide, or the like. The insulating film 205 can be formed by a sputtering method, a CVD method, a thermal oxidation method, a coating method, a printing method, or the like.

Note that the insulating film 205 functions as a base layer and can prevent or reduce diffusion of impurity elements from the substrate 111, the bonding layer 112, or the like to the transistor or the light-emitting element.

An organic resin material, a glass material that is thin enough to have flexibility, or the like can be used for the substrate 111 and the substrate 121. In the case where the display device 100 is a so-called bottom-emission display device or a dual-emission display device, a material that transmits light emitted from the EL layer 117 is used for the substrate 111. In the case where the display device 100 is a top-emission display device or a dual-emission display device, a material that transmits light emitted from the EL layer 117 is used for the substrate 121.

Examples of materials that have flexibility and transmit visible light, which can be used for the substrate 111 and the substrate 121, include a polyethylene terephthalate resin, a polyethylene naphthalate resin, a polyacrylonitrile resin, a polyimide resin, a polymethylmethacrylate resin, a polycarbonate resin, a polyethersulfone resin, a polyamide resin, a cycloolefin resin, a polystyrene resin, a polyamide imide resin, a polyvinylchloride resin, or the like. Examples of substrates that do not transmit light include a stainless steel substrate, a substrate with stainless steel foil, a tungsten substrate, a substrate with tungsten foil, and the like.

Alternatively, polypropylene, polyester, polyvinyl fluoride, polyvinyl chloride, polyamide, polyimide, an inorganic film formed by evaporation, paper, or the like can be used as the substrate 111 and the substrate 121. Still alternatively, a cellophane substrate, a stone substrate, a wood substrate, a cloth substrate (a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, or the like can be used.

The thermal expansion coefficients of the substrate 111 and the substrate 121 are preferably less than or equal to 30 ppm/K, more preferably less than or equal to 10 ppm/K. In addition, on surfaces of the substrate 111 and the substrate 121, a protective film having low water permeability may be formed in advance; examples of the protective film include a film containing nitrogen and silicon such as a silicon nitride film or a silicon oxynitride film and a film containing nitrogen and aluminum such as an aluminum nitride film. Note that a structure in which a fibrous body is impregnated with an organic resin (also called prepreg) may be used as the substrate 111 and the substrate 121.

With such substrates, a non-breakable display device can be provided. Alternatively, a lightweight display device can be provided. Alternatively, an easily bendable display device can be provided.

The transistor 231, the transistor 431, the capacitor 232, the transistor 233, and the terminal electrode 116 are formed over the insulating film 205 (see FIG. 2). Note that dual-gate transistors in each of which a semiconductor layer where a channel is formed is provided between two gate electrodes are described as examples of the transistor 431 and the transistor 233 in this embodiment. However, the transistor 431 and the transistor 233 can be single-gate transistors. For example, channel-protective transistors, top-gate transistors, or the like can be used as the transistor 431 and the transistor 233.

The transistor 231 which is not illustrated in FIG. 2 can also have a structure similar to those of other transistors. The transistor 231, the transistor 431, and the transistor 233 may have the same structure or different structures. Note that the size (e.g., channel length and channel width) or the like of each transistor may be adjusted as appropriate.

The transistor 431 and the transistor 233 each include a gate electrode 206, a gate insulating film 207, an oxide semiconductor film 208, a source electrode 209a, and a drain electrode 209b.

In addition, an insulating film 108 is formed over the transistor 431 and the transistor 233, an insulating film 109 is formed over the insulating film 108, and an insulating film 110 is formed over the insulating film 109. The insulating film 110 functions as a protective insulating layer and can prevent or reduce diffusion of impurity elements from a layer above the insulating film 110 to the transistor 431 and the transistor 233.

Part of the insulating film 108 and the insulating film 109 is removed from a region not overlapping with the transistor 431 and the transistor 233. The removal of the part of the insulating film 108 and the insulating film 109 makes the display device 100 more easily bendable.

An insulating film 211 is formed over the insulating film 110. Planarization treatment may be performed on the insulating film 211 to reduce unevenness of a surface on which the light-emitting element 125 is formed. The planarization treatment may be, but not particularly limited to, polishing treatment (e.g., chemical mechanical polishing (CMP)) or dry etching treatment.

In addition, over the insulating film 211, the light-emitting element 125 and a partition 114 for separating the light-emitting element 125 from adjacent light-emitting elements 125 are formed.

In addition, the substrate 121 is provided with a light-blocking film 264, a coloring layer 266, and an overcoat layer 268. The display device 100 is a so-called top-emission display device, in which light 235 emitted from the EL layer 117 is extracted from the substrate 121 side through the coloring layer 266.

The light-emitting element 125 is electrically connected to the transistor 231 via a wiring 241 through an opening formed in the insulating film 211, the insulating film 110, the insulating film 109, and the insulating film 108.

In an opening overlapping with the terminal electrode 116 and provided in the insulating film 211, the insulating film 110, the insulating film 109, and the insulating film 108, the external electrode 124 and the terminal electrode 116 are electrically connected to each other through an anisotropic conductive connection layer 123. For example, an FPC can be used as the external electrode 124.

The anisotropic conductive connection layer 123 can be formed using any of known anisotropic conductive films (ACF), anisotropic conductive pastes (ACP), and the like.

The anisotropic conductive connection layer 123 is formed by curing a paste-form or sheet-form material that is obtained by mixing conductive particles to a thermosetting resin or a thermosetting, light-curable resin. The anisotropic conductive connection layer 123 exhibits an anisotropic conductive property by light irradiation or thermocompression bonding. As the conductive particles used for the anisotropic conductive connection layer 123, for example, particles of a spherical organic resin coated with a thin-film metal such as Au, Ni, or Co can be used.

By electrical connection between the external electrode 124 and the terminal electrode 116 through the anisotropic conductive connection layer 123, electric power or signals can be input to the display device 100.

Figure 21:
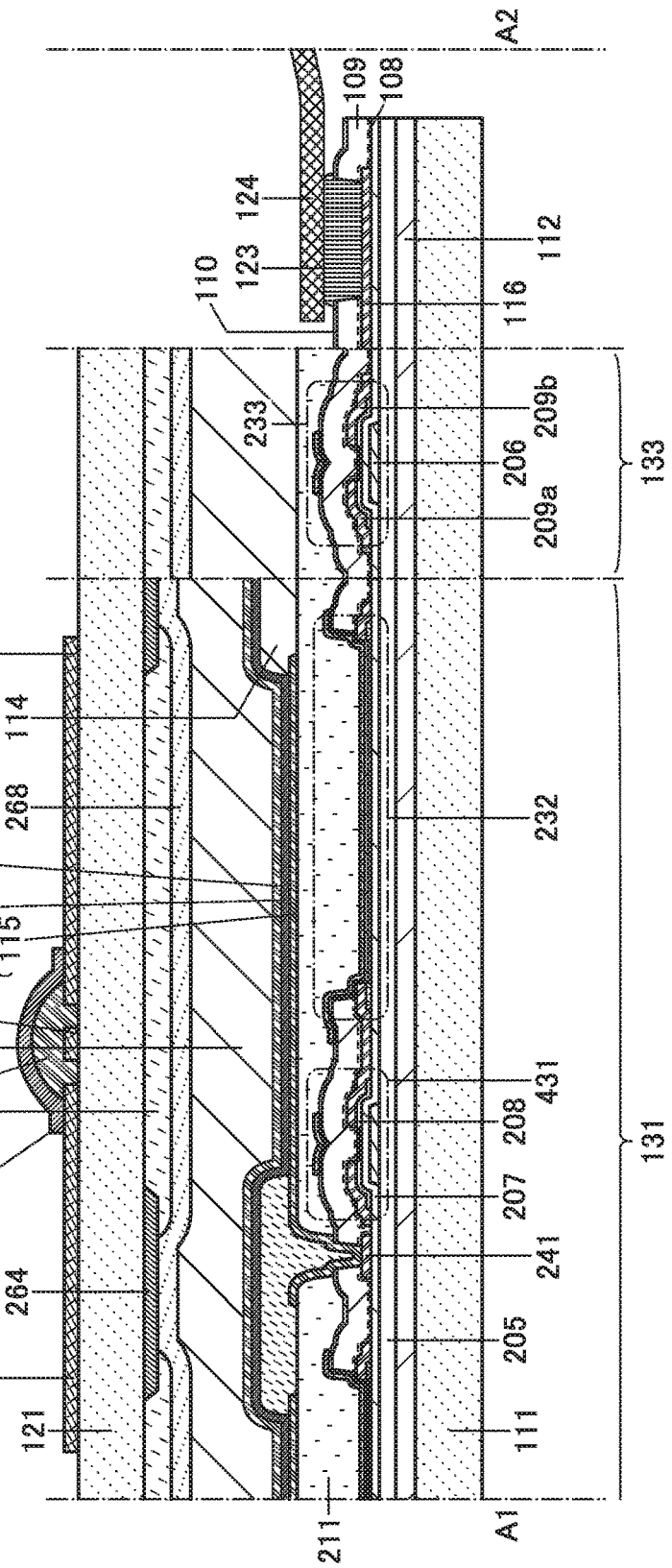
FIG. 21 is a cross-sectional view illustrating one embodiment of a display device.

Note that a touch sensor may be formed over the substrate 121 as illustrated in FIG. 21. As the touch sensor, any of various types such as a resistive type, a capacitive type, and an optical type can be used. As illustrated in FIG. 21, a touch sensor electrode 910a and a touch sensor electrode 910b are connected to each other through a wiring 912. In order to prevent contact with a touch sensor electrode 910c, an insulating layer 911 is provided thereover. The touch sensor electrodes 910a, 910b, and 910c are preferably formed using a transparent conductive film containing indium tin oxide, indium zinc oxide, or the like so as to be able to transmit light. The wiring 912 is provided in a small area and therefore can be formed using a single-layer film or a multilayer film containing a non-light-transmitting conductive material such as Al, Mo, Ti, or W. Note that a transparent conductive film containing indium tin oxide or indium zinc oxide may be used. The touch sensor directly formed over the substrate 121 as illustrated in FIG. 21 has the advantage of not being displaced easily when the display device 100 is bent.

Note that an optical sheet such as a polarizing plate or a retardation plate may be provided over the substrate 121.

Figure 22:
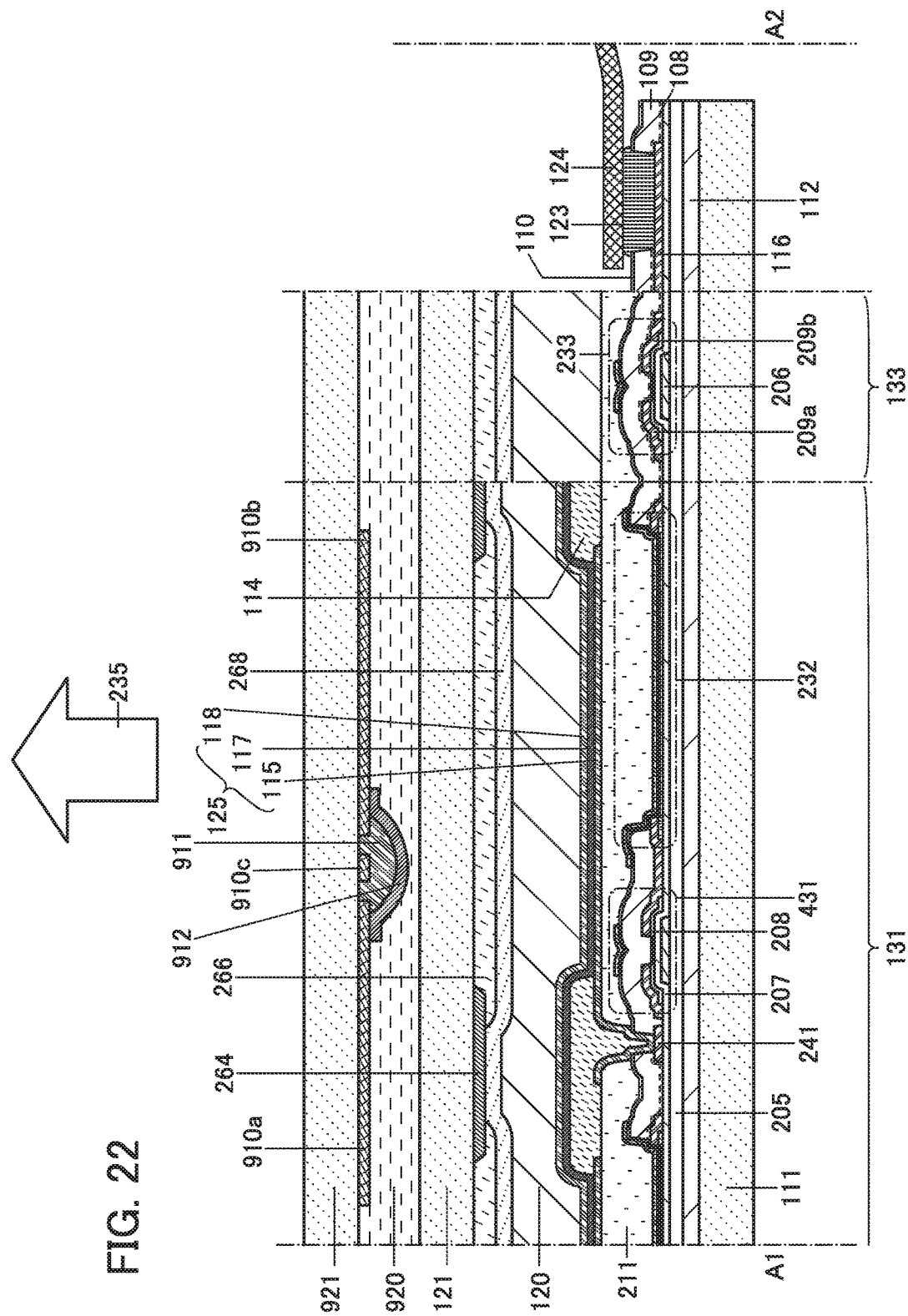
FIG. 22 is a cross-sectional view illustrating one embodiment of a display device.

Note that a touch sensor may be provided over a substrate other than the substrate 121. FIG. 22 illustrates an example in which a touch sensor is provided over a substrate other than the substrate 121. For example, a substrate 921 is an outermost substrate and corresponds to a cover for the display device 100. Thus, the display device 100 is operated by directly touching the cover with a human finger or a stylus pen. In the example illustrated in FIG. 22, the touch sensor is provided on a back side of the substrate 921. A bonding layer 920 is provided between the substrate 921 and the substrate 121 to fix these substrates. The bonding layer 920 may be formed using a material similar to that of the bonding layer 120. This has the advantage of not easily causing displacement even when the display device 100 is bent. In addition, there is no intermediate layer of air, and therefore, external light is not reflected easily. Thus, an increase in visibility is another advantage.

Note that the substrate 921 is preferably formed using a material similar to that of the substrates 121 and 111 when the display device 100 is used in a bent state. However, the display device 100 is non-breakable, and when the display device 100 is not used in a bent state, the substrate 921 may be a glass substrate. In particular, with the use of chemically-treated reinforced glass, a display device that is not easily scratched and is durable can be provided. For example, glass made of alkali alumino silicate can be used. The display device 100 is bendable and is therefore unlikely to be broken even when dropped; thus, a durable display device can be provided.

<Example of Pixel Circuit Configuration>

Figure 3A:
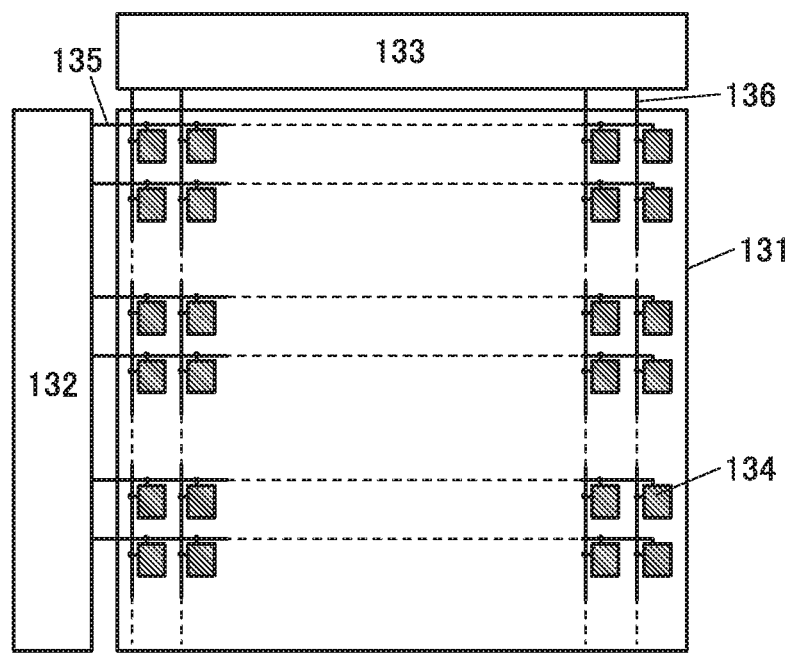
FIGS. 3A to 3C are a block diagram and circuit diagrams illustrating one embodiment of a display device.

Next, an example of a specific configuration of the display device 100 is described with reference to FIGS. 3A to 3C. FIG. 3A is a block diagram illustrating the configuration of the display device 100. The display device 100 includes the display area 131, the first driver circuit 132, and the second driver circuit 133. The first driver circuit 132 functions as a scan line driver circuit, for example, and the second driver circuit 133 functions as a signal line driver circuit, for example.

The display device 100 includes in scan lines 135 which are arranged in parallel or substantially in parallel to each other and whose potentials are controlled by the first driver circuit 132, and n signal lines 136 which are arranged in parallel or substantially in parallel to each other and whose potentials are controlled by the second driver circuit 133. The display area 131 includes a plurality of pixels 134 arranged in a matrix. The first driver circuit 132 and the second driver circuit 133 are collectively referred to as a driver circuit portion in some cases.

Each of the scan lines 135 is electrically connected to the n pixels 134 in the corresponding row among the pixels 134 arranged in m rows and n columns in the display area 131. Each of the signal lines 136 is electrically connected to the m pixels 134 in the corresponding column among the pixels 134 arranged in m rows and n columns. Note that m and n are each an integer of 1 or more.

Figure 3B:
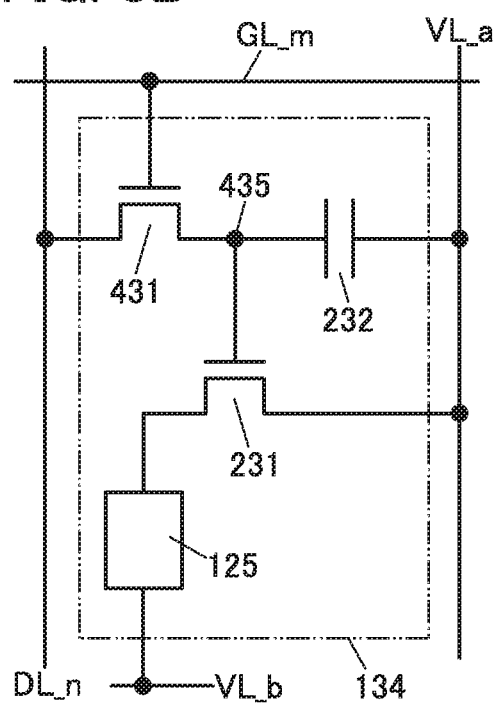
Figure 3C:
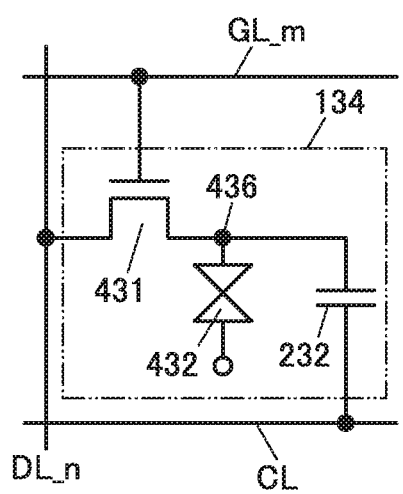

FIGS. 3B and 3C illustrate circuit configurations that can be used for the pixels 134 in the display device illustrated in FIG. 3A.

[Example of Pixel Circuit for Light-Emitting Display Device]

The pixel 134 illustrated in FIG. 3B includes a transistor 431, the capacitor 232, the transistor 231, and the light-emitting element 125.

One of a source electrode and a drain electrode of the transistor 431 is electrically connected to a wiring to which a data signal is supplied (hereinafter referred to as a signal line DL_n). A gate electrode of the transistor 431 is electrically connected to a wiring to which a gate signal is supplied (hereinafter referred to as a scan line GL_m).

The transistor 431 has a function of controlling whether to write a data signal to a node 435 by being turned on or off.

One of a pair of electrodes of the capacitor 232 is electrically connected to a wiring to which a particular potential is supplied (hereinafter referred to as a potential supply line VL_a), and the other is electrically connected to the node 435. The other of the source electrode and the drain electrode of the transistor 431 is electrically connected to the node 435.

The capacitor 232 functions as a storage capacitor for storing data written to the node 435.

One of a source electrode and a drain electrode of the transistor 231 is electrically connected to the potential supply line VL_a. A gate electrode of the transistor 231 is electrically connected to the node 435.

One of an anode and a cathode of the light-emitting element 125 is electrically connected to a potential supply line VL_b, and the other is electrically connected to the other of the source electrode and the drain electrode of the transistor 231.

As the light-emitting element 125, an organic electroluminescent element (also referred to as an organic EL element) or the like can be used, for example. Note that the light-emitting element 125 is not limited to organic EL elements; an inorganic EL element including an inorganic material can be used.

Note that a high power supply potential VDD is supplied to one of the potential supply line VL_a and the potential supply line VL_b, and a low power supply potential VSS is supplied to the other.

In the display device including the pixel 134 in FIG. 39, the pixels 134 are sequentially selected row by row by the first driver circuit 132, whereby the transistors 431 are turned on and a data signal is written to the nodes 435.

When the transistors 431 are turned off, the pixels 134 in which the data has been written to the nodes 435 are brought into a holding state. Further, the amount of current flowing between the source electrode and the drain electrode of the transistor 231 is controlled in accordance with the potential of the data written to the node 435. The light-emitting element 125 emits light with a luminance corresponding to the amount of flowing current. This operation is sequentially performed row by row; thus, an image is displayed.

[Example of Pixel Circuit for Liquid Crystal Display Device]

The pixel 134 illustrated in FIG. 3C includes a liquid crystal element 432, the transistor 431, and the capacitor 232.

The potential of one of a pair of electrodes of the liquid crystal element 432 is set according to the specifications of the pixels 134 as appropriate. The alignment state of the liquid crystal element 432 depends on data written to a node 436. A common potential may be applied to one of the pair of electrodes of the liquid crystal element 432 included in each of the plurality of pixels 134. Further, the potential supplied to one of a pair of electrodes of the liquid crystal element 432 in the pixel 134 in one row may be different from the potential supplied to one of a pair of electrodes of the liquid crystal element 432 in the pixel 134 in another row.

As examples of a driving method of the display device including the liquid crystal element 432, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an ITS mode, a transverse bend alignment (TBA) mode, and the like. Other examples of the driving method of the display device include an electrically controlled birefringence (ECB) mode, a polymer dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

The liquid crystal element 432 may be formed using a liquid crystal composition including liquid crystal exhibiting a blue phase and a chiral material. The liquid crystal exhibiting a blue phase has a short response time of 1 msec or less and is optically isotropic; therefore, alignment treatment is not necessary and viewing angle dependence is small.

Note that a display element other than the light-emitting element 125 and the liquid crystal element 432 can be used. For example, an electrophoretic element, an electronic ink, an electrowetting element, a micro electro mechanical system (MEMS), a digital micromirror device (DMD), a digital micro shutter (DMS), MIRASOL (registered trademark), an interferometric modulator (IMOD) element, or the like can be used as the display element.

In the pixel 134 in the m-th row and the n-th column, one of a source electrode and a drain electrode of the transistor 431 is electrically connected to a signal line DL_n, and the other is electrically connected to the node 436. A gate electrode of the transistor 431 is electrically connected to a scan line GL_m. The transistor 431 has a function of controlling whether to write a data signal to the node 436 by being turned on or off.

One of a pair of electrodes of the capacitor 232 is electrically connected to a wiring to which a particular potential is supplied (hereinafter referred to as a capacitor line CL), and the other is electrically connected to the node 436. The other of the pair of electrodes of the liquid crystal element 432 is electrically connected to the node 436. The potential of the capacitor line CL is set in accordance with the specifications of the pixel 134 as appropriate. The capacitor 232 functions as a storage capacitor for storing data written to the node 436.

For example, in the display device including the pixel 134 in FIG. 3C, the pixels 134 are sequentially selected row by row by the first driver circuit 132, whereby the transistors 431 are turned on and a data signal is written to the nodes 436.

When the transistors 431 are turned off, the pixels 134 in which the data signal has been written to the nodes 436 are brought into a holding state. This operation is sequentially performed row by row thus, an image is displayed.

<Example of Manufacturing Method>

Next, an example of a method for manufacturing the display device 100 will be described with reference to cross-sectional views in FIGS. 4A to 4C, FIGS. 5A to 5C, FIGS. 6A and 6B, FIGS. 7A and 7B, FIGS. 8A and 8B, FIGS. 9 to 11, and FIGS. 12A to 12C. FIGS. 4A to 12C correspond to a cross-section of the display area 131 in FIG. 2.

[Formation of Separation Layer]

Figure 4A:
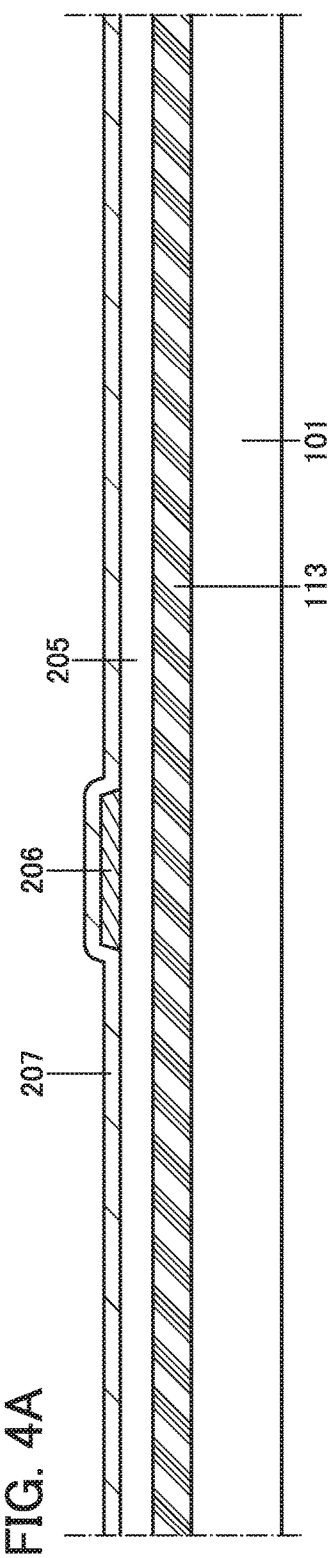
FIGS. 4A to 4C are cross-sectional views illustrating one embodiment of a method for manufacturing a display device.

First, a separation layer 113 is formed over an element formation substrate 101 (see FIG. 4A). Note that the element formation substrate 101 may be a glass substrate, a quartz substrate, a sapphire substrate, a ceramic substrate, a metal substrate, or the like. Alternatively, the element formation substrate 101 may be a plastic substrate having heat resistance to the processing temperature in this embodiment.

As the glass substrate, for example, a glass material such as aluminosilicate glass, aluminoborosilicate glass, or barium borosilicate glass is used. Note that when the glass substrate contains a large amount of barium oxide (BaO), the glass substrate can be heat-resistant and more practical. Alternatively, crystallized glass or the like may be used.

The separation layer 113 can be formed using an element selected from tungsten, molybdenum, titanium, tantalum, niobium, nickel, cobalt, zirconium, ruthenium, rhodium, palladium, osmium, iridium, and silicon; an alloy material containing any of the elements; or a compound material containing any of the elements. The separation layer 113 can also be formed to have a single-layer structure or a stacked-layer structure using any of the materials. Note that the crystalline structure of the separation layer 113 may be amorphous, microcrystalline, or polycrystalline. The separation layer 113 can also be formed using a metal oxide such as aluminum oxide, gallium oxide, zinc oxide, titanium dioxide, indium oxide, indium tin oxide, indium zinc oxide, or InGaZnO (IGZO).

The separation layer 113 can be formed by a sputtering method, a CVD method, a coating method, a printing method, or the like. Note that the coating method includes a spin coating method, a droplet discharge method, and a dispensing method.

In the case where the separation layer 113 has a single-layer structure, the separation layer 113 is preferably formed using tungsten, molybdenum, or a tungsten-molybdenum alloy. Alternatively, the separation layer 113 is preferably formed using an oxide or oxynitride of tungsten, an oxide or oxynitride of molybdenum, or an oxide or oxynitride of a tungsten-molybdenum alloy.

In the case where the separation layer 113 has a stacked-layer structure including, for example, a layer containing tungsten and a layer containing an oxide of tungsten, the layer containing an oxide of tungsten may be formed as follows: the layer containing tungsten is formed first and then an oxide insulating film is formed in contact therewith, so that the layer containing an oxide of tungsten is formed at the interface between the layer containing tungsten and the oxide insulating film. Alternatively, the layer containing an oxide of tungsten may be formed by performing thermal oxidation treatment, oxygen plasma treatment, treatment with a highly oxidizing solution such as ozone water, or the like on the surface of the layer containing tungsten.

In this embodiment, the separation layer 113 is formed of tungsten by a sputtering method.

[Formation of Base Layer]

Next, the insulating film 205 is formed as a base layer over the separation layer 113 (see FIG. 4A). The insulating film 205 is preferably formed as a single layer or a multi-layer using silicon oxide, silicon nitride, silicon oxynitride, silicon nitride oxide, aluminum oxide, aluminum oxynitride, aluminum nitride oxide, or the like. The insulating film 205 can be formed by a sputtering method, a CVD method, a thermal oxidation method, a coating method, a printing method, or the like.

The thickness of the insulating film 205 may be greater than or equal to 30 nm and less than or equal to 500 nm, preferably greater than or equal to 50 nm and less than or equal to 400 nm.

The insulating film 205 can prevent or reduce diffusion of impurity elements from the substrate 111, the bonding layer 112, or the like to the light-emitting element 125. In this embodiment, a silicon oxide film having a thickness of 200 nm is formed as the insulating film 205 by a plasma CVD method.

[Formation of Gate Electrode]

Next, the gate electrode 206 is formed over the insulating film 205 (see FIG. 4A). The gate electrode 206 can be formed using a metal element selected from aluminum, chromium, copper, tantalum, titanium, molybdenum, and tungsten; an alloy containing any of these metal elements as a component; an alloy containing any of these metal elements in combination; or the like. Further, one or more metal elements selected from manganese and zirconium may be used. The gate electrode 206 may have a single-layer structure or a stacked structure of two or more layers. For example, a single-layer structure of an aluminum film containing silicon, a two-layer structure in which an aluminum film is stacked over a titanium film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a two-layer structure in which a copper film is stacked over a titanium film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used.

The gate electrode 206 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

First, a conductive film to be the gate electrode 206 is stacked over the insulating film 205 by a sputtering method, a CVD method, an evaporation method, or the like, and a resist mask is formed over the conductive film by a photolithography process. Next, part of the conductive film to be the gate electrode 206 is etched with the use of the resist mask to form the gate electrode 206. At the same time, a wiring and another electrode can be formed.

The conductive film may be etched by a dry etching method, a wet etching method, or both a dry etching method and a wet etching method. Note that in the case where the conductive film is etched by a dry etching method, asking treatment may be performed before the resist mask is removed, whereby the resist mask can be easily removed using a stripper.

Note that the gate electrode 206 may be formed by an electrolytic plating method, a printing method, an inkjet method, or the like instead of the above formation method.

The thickness of the gate electrode 206 is greater than or equal to 5 nm and less than or equal to 500 nm, preferably greater than or equal to 10 nm and less than or equal to 300 nm, more preferably greater than or equal to 10 nm and less than or equal to 200 nm.

The gate electrode 206 may be formed using a light-blocking conductive material, whereby external light can be prevented from reaching the oxide semiconductor film 208 from the gate electrode 206 side. As a result, a variation in electrical characteristics of the transistor due to light irradiation can be suppressed.

[Formation of Gate Insulating Film]

Next, the gate insulating film 207 is formed (see FIG. 4A). The gate insulating film 207 can be formed to have a single-layer structure or a stacked-layer structure using, for example, any of silicon oxide, silicon oxynitride, silicon nitride oxide, silicon nitride, aluminum oxide, a mixture of aluminum oxide and silicon oxide, hafnium oxide, gallium oxide, Ga—Zn-based metal oxide, and the like.

The gate insulating film 207 may be formed using a high-k material such as hafnium silicate (HfSiO$_x$) hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current of the transistor can be reduced. For example, a stacked layer of silicon oxynitride and hafnium oxide may be used.

The thickness of the gate insulating film 207 is greater than or equal to 5 nm and less than or equal to 400 nm, preferably greater than or equal to 10 nm and less than or equal to 300 nm, more preferably greater than or equal to 0.50 nm and less than or equal to 250 nm.

The gate insulating film 207 can be formed by a sputtering method, a CVD method, an evaporation method, or the like.

In the case where a silicon oxide film, a silicon oxynitride film, or a silicon nitride oxide film is formed as the gate insulating film 207, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

The gate insulating film 207 can have a stacked-layer structure in which a nitride insulating film and an oxide insulating film are stacked in that order from the gate electrode 206 side. When the nitride insulating film is provided on the gate electrode 206 side, an impurity, typically hydrogen, nitrogen, alkali metal, alkaline earth metal, or the like, can be prevented from moving from the gate electrode 206 side to the oxide semiconductor film 208. Further, when the oxide insulating film is provided on the oxide semiconductor film 208 side, the density of defect states at the interface between the gate insulating film 207 and the oxide semiconductor film 208 can be reduced. Consequently, a transistor whose electrical characteristics are hardly degraded can be obtained. Note that it is preferable to form, as the oxide insulating film, an oxide insulating film containing oxygen at a higher proportion than the stoichiometric composition. This is because the density of defect states at the interface between the gate insulating film 207 and the oxide semiconductor film 208 can be further reduced.

In the case where the gate insulating film 207 is a stacked layer of a nitride insulating film and an oxide insulating film as described above, it is preferable that the nitride insulating film be thicker than the oxide insulating film.

The nitride insulating film has a dielectric constant higher than that of the oxide insulating film; therefore, an electric field generated from the gate electrode 206 can be efficiently transmitted to the oxide semiconductor film 208 even when the gate insulating film 207 has a large thickness. When the gate insulating film 207 has a large total thickness, the withstand voltage of the gate insulating film 207 can be increased. Accordingly, the reliability of the semiconductor device can be improved.

The gate insulating film 207 can have a stacked-layer structure in which a first nitride insulating film with few defects, a second nitride insulating film with a high blocking property against hydrogen, and an oxide insulating film are stacked in that order from the gate electrode 206 side. When the first nitride insulating film with few defects is used in the gate insulating film 207, the withstand voltage of the gate insulating film 207 can be improved. Further, when the second nitride insulating film with a high blocking property against hydrogen is provided in the gate insulating film 207, hydrogen contained in the gate electrode 206 and the first nitride insulating film can be prevented from moving to the oxide semiconductor film 208.

An example of a method for forming the first and second nitride insulating films is described below. First, a silicon nitride film with few defects is formed as the first nitride insulating film by a plasma CVD method in which a mixed gas of silane, nitrogen, and ammonia is used as a source gas. Next, a silicon nitride film in which the hydrogen concentration is low and hydrogen can be blocked is formed as the second nitride insulating film by switching the source gas to a mixed gas of silane and nitrogen. By such a formation method, the gate insulating, film 207 in which nitride insulating films with few defects and a blocking property against hydrogen are stacked can be formed.

The gate insulating film 207 can have a stacked-layer structure in which a third nitride insulating film with a high blocking property against an impurity, the first nitride insulating film with few defects, the second nitride insulating film with a high blocking property against hydrogen, and the oxide insulating film are stacked in that order from the gate electrode 206 side. When the third nitride insulating film with a high blocking property against an impurity is provided in the gate insulating film 207, an impurity, typically hydrogen, nitrogen, alkali metal, alkaline earth metal, or the like, can be prevented from moving from the gate electrode 206 to the oxide semiconductor film 208.

An example of a method for forming the first to third nitride insulating films is described below. First, a silicon nitride film with a high blocking property against an impurity is formed as the third nitride insulating film by a plasma CVD method in which a mixed gas of silane, nitrogen, and ammonia is used as a source gas. Next, a silicon nitride film with few defects is formed as the first nitride insulating film by increasing the flow rate of ammonia. Then, a silicon nitride film in which the hydrogen concentration is low and hydrogen can be blocked is formed as the second nitride insulating film by switching the source gas to a mixed gas of silane and nitrogen. By such a formation method, the gate insulating film 207 in which nitride insulating films with few defects and a blocking property against an impurity are stacked can be formed.

Moreover, in the case of forming a gallium oxide film as the gate insulating film 207, a metal organic chemical vapor deposition (MOCVD) method can be employed.

Note that the threshold voltage of a transistor can be changed by stacking the oxide semiconductor film 208 in which a channel of the transistor is formed and an insulating film containing hafnium oxide with an oxide insulating film provided therebetween and injecting electrons into the insulating film containing hafnium oxide.

[Formation of Oxide Semiconductor Film]

Figure 4B:
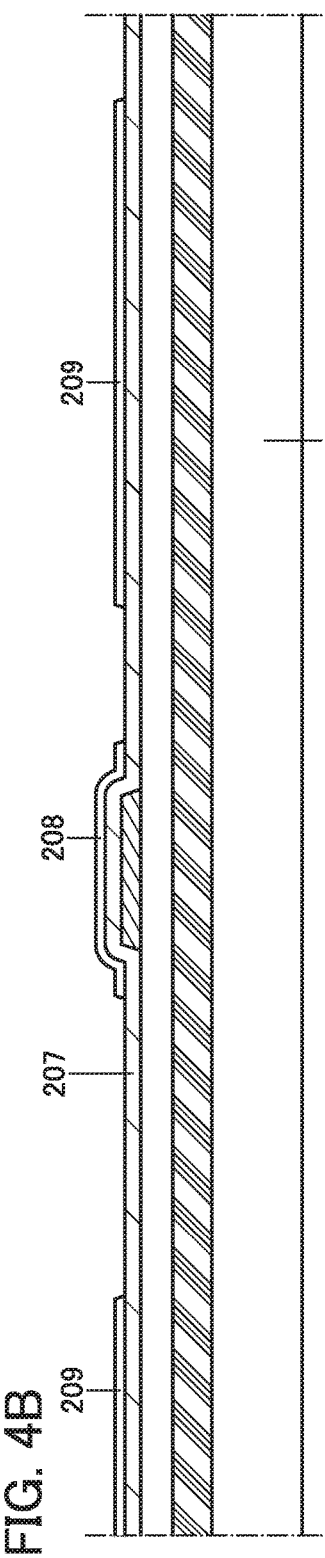
Figure 4C:
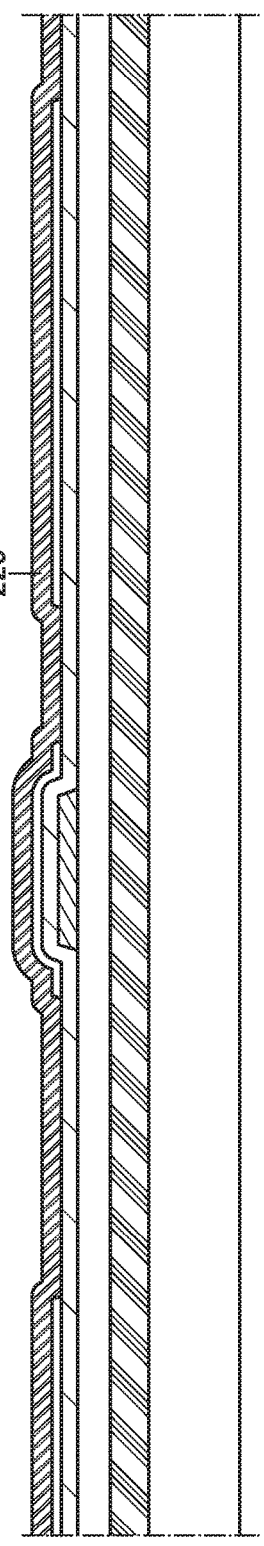

Next, the oxide semiconductor film 208 in which a channel is formed and an oxide semiconductor film 209 serving as one electrode of the capacitor 232 later are formed over the gate insulating film 207 (see FIG. 4B). Typical examples of a material that can be used for the oxide semiconductor film 208 and the oxide semiconductor film 209 include an In—Ga oxide, an In—Zn oxide, and an In-M-Zn oxide (M represents Al, Ga, Y, Zr, La, Ce, or Nd).

In the case where the oxide semiconductor film 208 contains an In-M-Zn oxide, the proportions of In and M when summation of In and M is assumed to be 100 atomic % are preferably as follows: the atomic percentage of In is greater than or equal to 25 atomic % and the atomic percentage of M is less than 75 atomic %, or more preferably, the atomic percentage of In is greater than or equal to 34 atomic % and the atomic percentage of M is less than 66 atomic %.

The energy gap of the oxide semiconductor film 208 is particularly 2 eV or more, preferably 2.5 eV or more, more preferably 3 eV or more. With the use of an oxide semiconductor having such a wide energy gap, the off-state current of the transistor can be reduced.

The thickness of the oxide semiconductor film 208 and the oxide semiconductor film 209 is set to greater than or equal to 3 nm and less than or equal to 200 nm, preferably greater than or equal to 3 nm and less than or equal to 100 nm, more preferably greater than or equal to 3 nm and less than or equal to 50 nm.

In the case where the oxide semiconductor film 208 and the oxide semiconductor film 209 contain an In-M-Zn oxide (M represents Al, Ga, Y, Zr, La, Ce, or Nd), the atomic ratio of metal elements of a sputtering target used for depositing the In-M-Zn oxide preferably satisfies In≥M and Zn>M. As the atomic ratio of metal elements of such a sputtering target, In:M:Zn=1:1:1, In:M:Zn=5:5:6, In:M:Zn=2:1:2, and In:M:Zn=3:1:2 are preferable. Note that the atomic ratios of metal elements in the oxide semiconductor film 208 and the oxide semiconductor film 209 vary from those in the above-described sputtering target, within a range of ±40% as an error. When the content of In in the oxide semiconductor film 208 is high, the on-state current and the field-affect mobility of the transistor are increased. Thus, when the oxide semiconductor film 208 is formed using a sputtering target of the In-M-Zn oxide having an atomic ratio of In:M:Zn=3:1:2, the transistor having excellent electrical characteristics can be fabricated.

An oxide semiconductor film with low carrier density is used as the oxide semiconductor film 208. For example, an oxide semiconductor film whose carrier density is $1\times10^{17}/cm^3$ or lower, preferably $1\times10^{15}/cm^3$ or lower, more preferably $1\times10^{13}/cm^3$ or lower, still more preferably $1\times10^{11}/cm^3$ or lower is used as the oxide semiconductor film 208.

Note that, without limitation to that described above, a material with an appropriate composition may be used depending on required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 208 be set to be appropriate.

Note that it is preferable to use, as the oxide semiconductor film 208, an oxide semiconductor film in which the impurity concentration is low and the density of defect states is low, in which case the transistor can have more excellent electrical characteristics. The state in which the impurity concentration is low and the density of defect states is low (the number of oxygen vacancies is small) is referred to as a "highly purified intrinsic" or "substantially highly purified intrinsic" state. A highly purified intrinsic or substantially highly purified intrinsic oxide semiconductor has few carrier generation sources, and thus can have a low carrier density in some cases. Thus, a transistor in which a channel region is formed in the oxide semiconductor film rarely has a negative threshold voltage (is rarely normally on). Further, a highly purified intrinsic or substantially highly purified intrinsic oxide semiconductor film has a low density of defect states and thus has a low density of trap states in some cases.

Further, a transistor including a highly purified intrinsic or substantially highly purified intrinsic oxide semiconductor film as a semiconductor film in which a channel is formed has an extremely low off-state current; even when the transistor has a channel width of $1\times10^6$ μm and a channel length (L) of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability in some cases. Electric charges trapped by the trap states in the oxide semiconductor film take a long time to be lost, and might behave like fixed electric charges. Thus, the transistor in which a channel region is formed in the oxide semiconductor film having a high density of trap states has unstable electrical characteristics in some cases. Examples of the impurities include hydrogen, nitrogen, alkali metal, alkaline earth metal, and the like.

Hydrogen contained in the oxide semiconductor film reacts with oxygen bonded to a metal atom to form water, and in addition, an oxygen vacancy is formed in a lattice from which oxygen is released (or in a portion from which oxygen is released). Due to entry of hydrogen into the oxygen vacancy, an electron serving as a carrier is generated in some cases. Further, in some cases, bonding of part of hydrogen to oxygen bonded to a metal element causes generation of an electron serving as a carrier. Thus, a transistor including an oxide semiconductor which contains hydrogen is likely to be normally on.

Accordingly, it is preferable that hydrogen be reduced as much as possible in the oxide semiconductor film 208. Specifically, the hydrogen concentration of the oxide semiconductor film 208, which is measured by secondary ion mass spectrometry (SIMS), is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$, yet more preferably lower than or equal to $1\times10^{18}$ atoms/cm$^3$, even more preferably lower than or equal to $5\times10^{17}$ atoms/cm$^3$, or further preferably lower than or equal to $1\times10^{16}$ atoms/cm$^3$.

When silicon or carbon which is one of elements belonging to Group 14 is contained in the oxide semiconductor film 208, oxygen vacancies are increased, and the oxide semiconductor film 208 becomes n-type. Thus, the concentration of silicon or carbon (the concentration is measured by SIMS) of the oxide semiconductor film 208 is lower than or equal to $2\times10^{18}$ atoms/cm$^3$, preferably lower than or equal to $2\times10^{17}$ atoms/cm$^3$.

Further, the concentration of alkali metal or alkaline earth metal of the oxide semiconductor film 208, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 208.

Further, when containing nitrogen, the oxide semiconductor film 208 easily has n-type conductivity by generation of electrons serving as carriers and an increase of carrier density. Thus, a transistor including an oxide semiconductor which contains nitrogen is likely to be normally on. For this reason, nitrogen in the oxide semiconductor film is preferably reduced as much as possible; the concentration of nitrogen which is measured by SIMS is preferably set to, for example, lower than or equal to $5\times10^{18}$ atoms/cm$^3$.

A structure of an oxide semiconductor film is described below.

An oxide semiconductor film is classified roughly into a non-single-crystal oxide semiconductor film and a single crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films including a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface where the CAAC-OS film is formed (hereinafter, a surface where the CAAC-OS film is formed is also referred to as a formation surface or a top surface of the CAAC-OS film, and is arranged in parallel to the formation surface or the top surface of the CAAC-OS film.

On the other hand, according to a TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

Note that in an electron diffraction pattern of the CAAC-OS film, spots (bright spots) having alignment are shown.

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the plan TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film with a low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which the impurity concentration is low and the density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and has high reliability. Electric charges trapped by the carrier traps in the oxide semiconductor film take a long time to be released, and might behave like fixed electric charges. Thus, the transistor which includes the oxide semiconductor film having high impurity concentration and a high density of defect states has unstable electrical characteristics in some cases.

With use of the CAAC-OS film in a transistor, a variation in the electrical characteristics of the transistor due to irradiation with visible light or ultraviolet light is small.

Next, a polycrystalline oxide semiconductor film is described.

In an image of a polycrystalline oxide semiconductor film which is obtained with a TEM, crystal grains can be found. In most cases, the size of the crystal grains in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in an image obtained with the TEM, for example. Moreover, in an image of the polycrystalline oxide semiconductor film which is obtained with the TEM, a boundary between crystal grains can be found in some cases.

The polycrystalline oxide semiconductor film may include a plurality of crystal grains, and the plurality of crystal grains may be oriented in different directions. A polycrystalline oxide semiconductor film is subjected to structural analysis with an XRD apparatus. For example, when a polycrystalline oxide semiconductor film including an $InGaZnO_4$ crystal is analyzed by an out-of-plane method, peaks of 2θ appear at around 31°, 36°, and the like in some cases.

The polycrystalline oxide semiconductor film has high crystallinity and thus has high electron mobility in some cases. Accordingly, a transistor including the polycrystalline oxide semiconductor film has high field-effect mobility. Note that there are cases in which an impurity is segregated at the grain boundary in the polycrystalline oxide semiconductor film. Moreover, the grain boundary of the polycrystalline oxide semiconductor film becomes a defect state. Since the grain boundary of the polycrystalline oxide semiconductor film may serve as a carrier trap or a carrier generation source, the transistor including the polycrystalline oxide semiconductor film has larger variation in electrical characteristics and lower reliability than a transistor including a CAAC-OS film in some cases.

Next, a microcrystalline oxide semiconductor film is described.

In an image obtained with the TEM, crystal parts cannot be found clearly in the microcrystalline oxide semiconductor film in some cases. In most cases, the size of a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm, is specifically referred to as nanocrystal (nc). An oxide semiconductor film including nanocrystal is referred to as an nc-OS (nanocrystalline oxide semiconductor) film. In an image of the nc-OS film which is obtained with the TEM, for example, a boundary is not clearly detected in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak which shows a crystal plane does not appear. Further, a diffraction pattern like a halo pattern appears in a selected-area electron diffraction pattern of the nc-OS film which is obtained by using an electron beam having a diameter (e.g., larger than or equal to 50 nm) larger than the size of a crystal part. Meanwhile, spots are observed in a nanobeam electron diffraction pattern of the nc-OS film obtained by using an electron beam having a diameter e.g., larger than or equal to 1 nm and smaller than or equal to 30 nm) close to or smaller than the size of a crystal part. Further, in a nanobeam electron diffraction pattern of the nc-OS film, for example, bright regions in a circular (or ring-shaped) pattern are shown in some cases. Also in a nanobeam electron diffraction pattern of the nc-OS film, a plurality of spots are shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Accordingly, the nc-OS film has higher carrier density than the CAAC-OS film in some cases. An oxide semiconductor film with a high carrier density tends to have a high electron mobility. Therefore, a transistor including the nc-OS film has a high field-effect mobility in some cases. The nc-OS film has a higher density of defect states than the CAAC-OS film, and thus may have a lot of carrier traps. Consequently, the transistor including the nc-OS film has larger variation in electrical characteristics and lower reliability than a transistor including the CAAC-OS film. Note that the nc-OS film can be easily formed as compared to the CAAC-OS film because the nc-OS film can be obtained even when the amount of impurity contained therein is relatively large; thus, the nc-OS film is sometimes preferably used depending on the application. Therefore, a semiconductor device including the transistor including the nc-OS film can be manufactured with high productivity.

Next, an amorphous oxide semiconductor film is described.

The amorphous oxide semiconductor film has disordered atomic arrangement and no crystal parts. For example, the amorphous oxide semiconductor film does not have a specific state as in quartz.

In an image obtained with the TEM, crystal parts cannot be found in the amorphous oxide semiconductor film.

When the amorphous oxide semiconductor film is subjected to structural analysis by an out-of-plane method with an XRD apparatus, a peak which shows a crystal plane does not appear. A halo pattern is observed in an electron diffraction pattern of the amorphous oxide semiconductor film. Further, a halo pattern is observed but a spot is not shown in a nanobeam electron diffraction pattern of the amorphous oxide semiconductor film.

The amorphous oxide semiconductor film contains impurities such as hydrogen at a high concentration. In addition, the amorphous oxide semiconductor film has a high density of defect states.

The oxide semiconductor film having a high impurity concentration and a high density of defect states has many carrier traps or many carrier generation sources.

Thus, the amorphous oxide semiconductor film has a much higher carrier density than the nc-OS film in some cases. Therefore, a transistor including the amorphous oxide semiconductor film tends to be normally on. Therefore, in some cases, such an amorphous oxide semiconductor film can be applied to a transistor which needs to be normally on. Since the amorphous oxide semiconductor film has a high density of defect states, carrier traps might be increased. Consequently, a transistor including the amorphous oxide semiconductor film has larger variation in electrical characteristics and lower reliability than a transistor including the CAAC-OS film or the nc-OS film.

Next, a single crystal oxide semiconductor film is described.

The single crystal oxide semiconductor film has a lower impurity concentration and a lower density of defect states (few oxygen vacancies). Thus, the carrier density can be decreased. Therefore, a transistor including the single crystal oxide semiconductor film is unlikely to be normally on. Moreover, since the single crystal oxide semiconductor film has a lower impurity concentration and a lower density of defect states, carrier traps might be reduced. Therefore, a transistor including the single crystal oxide semiconductor film has a small variation in electrical characteristics and a high reliability in some cases.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

Note that an oxide semiconductor film may be a stacked film including two or more kinds of an amorphous oxide semiconductor film, a microcrystalline oxide semiconductor film, and a CAAC-OS film, for example.

A method for forming the oxide semiconductor film 208 and the oxide semiconductor film 209 is described below. An oxide semiconductor film which is to be the oxide semiconductor film 208 and the oxide semiconductor film 209 is formed over the gate insulating film 207. Then, after a resist mask is formed over the oxide semiconductor film by a photolithography process, part of the oxide semiconductor film is etched using the resist mask. Thus, the oxide semiconductor film 208 and the oxide semiconductor film 209 can be formed.

The oxide semiconductor film can be formed by a sputtering method, a coating method, a pulsed laser deposition method, a laser ablation method, a CVD method, or the like. Note that in the case where an oxide semiconductor film is formed by a sputtering method, a power supply device for generating plasma can be an RF power supply device, an AC power supply device, a DC power supply device, or the like as appropriate.

As a sputtering gas, a rare gas (typically argon) atmosphere, an oxygen atmosphere, or a mixed gas of a rare gas and oxygen is used as appropriate. In the case of using the mixed gas of a rare gas and oxygen, the proportion of oxygen to the rare gas is preferably increased.

Further, a sputtering target may be appropriately selected in accordance with the composition of the oxide semiconductor film to be formed.

In order to obtain a highly purified intrinsic or substantially highly purified intrinsic oxide semiconductor film, it is necessary to highly purify a sputtering gas as well as to evacuate a chamber to a high vacuum. As an oxygen gas or an argon gas used for a sputtering gas, a gas which is highly purified to have a dew point of −40° C. or lower, preferably −80° C. or lower, more preferably −100° C. or lower, or still preferably −120° C. or lower is used, whereby entry of moisture or the like into the oxide semiconductor film can be minimized.

Here, a 35-nm-thick In—Ga—Zn oxide film is formed as the oxide semiconductor film by a sputtering method using an In—Ga—Zn oxide target with an atomic ratio of In:Ga:Zn=1:1:1. Next, a resist mask is formed over the oxide semiconductor film, and part of the oxide semiconductor film is selectively etched. Thus, the oxide semiconductor film 208 and the oxide semiconductor film 209 can be formed.

Then, first heat treatment may be performed. The first heat treatment can reduce the concentrations of hydrogen and water contained in the oxide semiconductor film 208 and the oxide semiconductor film 209 by releasing hydrogen, water, and the like from the oxide semiconductor film 208 and the oxide semiconductor film 209. The heat treatment is performed typically at a temperature of higher than or equal to 300° C. and lower than or equal to 400° C., preferably higher than or equal to 320° C. and lower than or equal to 370° C.

The first heat treatment can be performed using an electric furnace, an RTA apparatus, or the like. With the use of an RTA apparatus, the heat treatment can be performed at a temperature of higher than or equal to the strain point of the substrate if the heating time is short. Therefore, the heat treatment time can be shortened.

The first heat treatment may be performed under an atmosphere of nitrogen, oxygen, ultra-dry air (air with a water content of 20 ppm or less, preferably 1 ppm or less, more preferably 10 ppb or less), or a rare gas (argon, helium, or the like). The atmosphere of nitrogen, oxygen, ultra-dry air, or a rare gas preferably does not contain hydrogen, water, and the like. Further, after heat treatment performed in a nitrogen atmosphere or a rare gas atmosphere, heat treatment may be additionally performed in an oxygen atmosphere or an ultra-dry air atmosphere. As a result, hydrogen, water, and the like can be released from the oxide semiconductor film 208 and the oxide semiconductor film 209 and oxygen can be supplied to the oxide semiconductor film 208 and the oxide semiconductor film 209 at the same time. Consequently, the amount of oxygen vacancies in the oxide semiconductor film 208 and the oxide semiconductor film 209 can be reduced.

Although an example in which the oxide semiconductor film 209 is formed as one electrode of the capacitor 232 is described, one embodiment of the present invention is not limited to this example. In some cases or depending on the situation, as one electrode of the capacitor 232, a conductive film which does not have a light-transmitting property may be used, or a film which is formed in a step different from that for the oxide semiconductor film 208 may be used. In other words, one electrode of the capacitor 232 may be provided so as not to be in contact with an upper surface of the gate insulating film 207.

[Formation of Source Electrode and Drain Electrode]

Next, the source electrode 209a, the drain electrode 209b, and an electrode 210 are formed. First, a conductive film 220 is formed over the insulating film 205, the oxide semiconductor film 208, and the oxide semiconductor film 209 (see FIG. 4C).

The conductive film 220 can have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, a three-layer structure in which a tungsten film, a copper film, and a tungsten film are stacked in this order, and the like can be given.

Note that a conductive material containing oxygen such as indium tin oxide, zinc oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, or a conductive material containing nitrogen such as titanium nitride or tantalum nitride may be used. It is also possible to employ a stacked-layer structure formed using a material containing the above metal element and conductive material containing oxygen. It is also possible to employ a stacked-layer structure formed using a material containing the above metal element and conductive material containing nitrogen. It is also possible to use a stacked-layer structure formed using a material containing the above metal element, conductive material containing oxygen, and conductive material containing nitrogen.

The thickness of the conductive film 220 is greater than or equal to 5 nm and less than or equal to 500 nm, preferably greater than or equal to 10 nm and less than or equal to 300 nm, more preferably greater than or equal to 10 nm and less than or equal to 200 nm. In this embodiment, a 300-nm-thick tungsten film is formed as the conductive film 220.

Next, a resist mask is formed over the conductive film 220 by a photolithography process, and part of the conductive film 220 is selectively etched using the resist mask. Thus, the source electrode 209a, the drain electrode 209b, and the electrode 210 are formed. Another electrode and a wiring, such as the terminal electrode 116, can be formed at the same time.

Note that the conductive film 220 may be etched by a dry etching method, a wet etching method, or both a dry etching method and a wet etching method. Note that an exposed portion of the oxide semiconductor film may be removed by the etching step in some cases (see FIG. 5A).

[Formation of Oxide Insulating Film]

Next, the insulating film 108 is formed. The insulating film 108 is an oxide insulating film which is permeable to oxygen. Note that the insulating film 108 serves also as a film which relieves damage to the oxide semiconductor film 208 at the time of forming the insulating film 109 later (see FIG. 5B).

Silicon oxide, silicon oxynitride, or the like with a thickness greater than or equal to 5 nm and less than or equal to 150 nm, preferably greater than or equal to 5 nm and less than or equal to 0.50 nm can be used as the insulating film 108. Note that in this specification, an "oxynitride film" refers to a film that contains oxygen at a higher proportion than nitrogen, and a "nitride oxide film" refers to a film that contains nitrogen at a higher proportion than oxygen.

Further, it is preferable that the amount of defects in the insulating film 108 be small, and typically the spin density corresponding to an ESR signal at g=2.001 due to a dangling bond of silicon be lower than or equal to $3\times10^{17}$ spins/cm$^3$. This is because if the density of defects in the insulating film 108 is high, oxygen is bonded to the detects and the amount of oxygen that permeates the insulating film 108 is decreased.

Further, it is preferable that the amount of defects at the interface between the insulating film 108 and the oxide semiconductor film 208 be small, and typically the spin density corresponding to a signal which appears at g=1.93 due to a defect in the oxide semiconductor film 208 be lower than or equal to $1\times10^{17}$ spins/cm$^3$, more preferably lower than or equal to the lower limit of detection by ESR measurement.

Note that in the insulating film 108, all oxygen having entered the insulating film 108 from the outside does not move to the outside of the insulating film 108 and some oxygen remains in the insulating film 108. Further, movement of oxygen occurs in the insulating film 108 in some cases in such a manner that oxygen enters the insulating film 108 and oxygen contained in the insulating film 108 is moved to the outside of the insulating film 108.

When the oxide insulating film which is permeable to oxygen is formed as the insulating film 108, oxygen released from the insulating film 109 provided over the insulating film 108 can be moved to the oxide semiconductor film 208 through the insulating film 108.

A silicon oxide film or a silicon oxynitride film is preferably used as the insulating film 108. The silicon oxide film or the silicon oxynitride film used as the insulating film 108 can be formed under the following conditions: the substrate placed in a treatment chamber of a plasma CVD apparatus that is vacuum-evacuated is held at a temperature higher than or equal to 280° C. and lower than or equal to 400° C., the pressure in the treatment chamber is greater than or equal to 20 Pa and less than or equal to 250 Pa, preferably greater than or equal to 100 Pa and less than or equal to 250 Pa with introduction of a source gas into the treatment chamber, and a high-frequency power is supplied to an electrode provided in the treatment chamber.

A deposition gas containing silicon and an oxidizing gas are preferably used as a source gas for forming the silicon oxide film or the silicon oxynitride film. Typical examples of the deposition gas containing silicon include same, disilane, trisilane, and silane fluoride. As the oxidizing gas, oxygen, ozone, dinitrogen monoxide, nitrogen dioxide, and the like can be given as examples.

With the use of the above conditions, an oxide insulating film which is permeable to oxygen can be formed as the insulating film 108. Further, by providing the insulating film 108, damage to the oxide semiconductor film 208 can be reduced in a step of forming the insulating film 109.

Under the above film formation conditions, the bonding strength of silicon and oxygen becomes strong in the above substrate temperature range. Thus, as the insulating film 108, a dense and hard oxide insulating film which is permeable to oxygen, typically, a silicon oxide film or a silicon oxynitride film of which etching using hydrofluoric acid of 0.5 wt % at 25° C. is performed at a rate of lower than or equal to 10 nm/min, preferably lower than or equal to 8 nm/min can be formed.

The insulating film 108 is formed while heating is performed; thus, hydrogen, water, or the like contained in the oxide semiconductor film 208 and the oxide semiconductor film 209 can be released in the step. Specifically, the insulating film 108 is formed while the element formation substrate 101 is kept at 280° C. to 400° C.; thus, hydrogen, water, or the like contained in the oxide semiconductor film 208 can be released. Hydrogen contained in the oxide semiconductor film 208 is bonded to an oxygen radical formed in plasma to form water. Since the substrate is heated in the step of forming the insulating film 108, water formed by bonding of oxygen and hydrogen is released from the oxide semiconductor film. That is, when the insulating film 108 is formed by a plasma CVD method, the amount of water and hydrogen contained in the oxide semiconductor film can be reduced.

Further, time for heating in a state where the oxide semiconductor film 208 and the oxide semiconductor film 209 are exposed can be shortened because healing is performed in the step of forming the insulating film 108. Thus, the amount of oxygen released from the oxide semiconductor films by heat treatment can be reduced. That is, the amount of oxygen vacancies in the oxide semiconductor films can be reduced.

Furthermore, by setting the pressure in the treatment chamber to be greater than or equal to 100 Pa and less than or equal to 250 Pa, the amount of water contained in the insulating film 108 is reduced; thus, variation in electrical characteristics of the transistor can be reduced and change in threshold voltage can be inhibited.

Moreover, by setting the pressure in the treatment chamber to be greater than or equal to 100 Pa and less than or equal to 250 Pa, damage to the oxide semiconductor film 208 and the oxide semiconductor film 209 can be reduced when the insulating film 108 is formed, so that the amount of oxygen vacancies contained in the oxide semiconductor film 208 and the oxide semiconductor film 209 can be reduced. In particular, when the film formation temperature of the insulating film 108 or the insulating film 109 which is formed later is set to be high, typically higher than 220° C., part of oxygen contained in the oxide semiconductor film 208 and the oxide semiconductor film 209 is released and oxygen vacancies are easily formed.

Further, when the insulating film 109 which is formed later is formed under the film formation conditions where the amount of defects in the film is decreased to increase reliability of the transistor, the amount of oxygen released from the insulating film 109 is easily reduced. Then, it is difficult to fill oxygen vacancies in the oxide semiconductor film 208 and the oxide semiconductor film 209 by oxygen supply from the insulating film 109 in some cases. However, by setting the pressure in the treatment chamber to be greater than or equal to 100 Pa and less than or equal to 250 Pa to reduce damage to the oxide semiconductor film 208 and the oxide semiconductor film 209 at the time of forming the insulating film 108, oxygen vacancies in the oxide semiconductor film 208 and the oxide semiconductor film 209 can be reduced even when the amount of oxygen supplied from the insulating film 109 is small.

Note that when the ratio of the amount of the oxidizing gas to the amount of the deposition gas containing silicon is 100 or higher, the hydrogen content in the insulating film 108 can be reduced. Consequently, the amount of hydrogen entering the oxide semiconductor film 208 and the oxide semiconductor film 209 can be reduced; thus, the negative shift in the threshold voltage of the transistor can be inhibited.

In this embodiment, as the insulating film 108, a 50-nm-thick silicon oxynitride film is formed by a plasma CVD method in which silane and dinitrogen monoxide are used as a source gas. Under the above conditions, a silicon oxynitride film which is permeable to oxygen can be formed.

Next, the insulating film 109 is formed in contact with the insulating film 108. The insulating film 109 is formed using an oxide insulating film which contains oxygen at a higher proportion than the stoichiometric composition. Part of oxygen is released by heating from the oxide insulating film which contains oxygen at a higher proportion than the stoichiometric composition. The oxide insulating film containing oxygen at a higher proportion than the stoichiometric composition is an oxide insulating film of which the amount of released oxygen converted into oxygen atoms is greater than or equal to $1.0\times10^{18}$ atoms/cm$^3$, preferably greater than or equal to $3.0\times10^{20}$ atoms/cm$^3$ in TDS analysis. Note that the substrate temperature in the TDS analysis is preferably higher than or equal to 100° C. and lower than or equal to 700° C., or higher than or equal to 100° C. and lower than or equal to 500° C.

Note that after the insulating film 108 is formed, the insulating film 109 is preferably formed in succession without exposure to the air. After the insulating film 108 is formed, the insulating film 109 is formed in succession by adjusting at least one of the flow rate of a source gas, pressure, a high-frequency power, and a substrate temperature without exposure to the air, whereby the concentration of impurities attributed to the atmospheric component at the interface between the insulating film 108 and the insulating film 109 can be reduced and oxygen in the insulating film 109 can be moved to the oxide semiconductor film 208 and the oxide semiconductor film 209; accordingly, the amount of oxygen vacancies in the oxide semiconductor film 208 and the oxide semiconductor film 209 can be reduced.

Further, it is preferable that the amount of defects in the insulating film 109 be small, and typically the spin density corresponding to a signal which appears at g=2.001 due to a dangling bond of silicon, be lower than $1.5\times10^{18}$ spins/cm$^3$, more preferably lower than or equal to $1\times10^{18}$ spins/cm$^3$ by ESR measurement. Note that the insulating film 109 is provided more apart from the oxide semiconductor film 208 than the insulating film 108 is; thus, the insulating film 109 may have higher defect density than the insulating film 108.

A silicon oxide film or a silicon oxynitride film is preferably used as the insulating film 109. The silicon oxide film or the silicon oxynitride film used as the insulating film 109 can be formed under the following conditions: the substrate placed in a treatment chamber of a plasma CVD apparatus that is vacuum-evacuated is held at a temperature higher than or equal to 180° C. and lower than or equal to 280° C., preferably higher than or equal to 200° C. and lower than or equal to 240° C., the pressure in the treatment chamber is greater than or equal to 100 Pa and less than or equal to 250 Pa, preferably greater than or equal to 100 Pa and less than or equal to 200 Pa with introduction of a source gas into the treatment chamber, and a high-frequency power higher than or equal to 0.17 W/cm$^2$ and lower than or equal to 0.5 W/cm$^2$, preferably higher than or equal to 0.25 W/cm$^2$ and lower than or equal to 0.35 W/cm$^2$ is supplied to an electrode provided in the treatment chamber.

The thickness of the insulating film 109 can be greater than or equal to 30 nm and less than or equal to 500 nm, preferably greater than or equal to 50 nm and less than or equal to 400 nm.

As the film formation conditions for the insulating film 109, the high-frequency power having the above power density is supplied to the treatment chamber having the above pressure, whereby the decomposition efficiency of the source gas in plasma is increased, oxygen radicals are increased, and oxidation of the source gas is promoted; therefore, the oxygen content in the insulating film 109 becomes higher than that in the stoichiometric composition. On the other hand, in the film formed at a substrate temperature within the above temperature range, the bond between silicon and oxygen is weak, and accordingly, part of oxygen in the film is released by heat treatment in the later step. Thus, it is possible to form an oxide insulating film which contains oxygen at a higher proportion than the stoichiometric composition and from which part of oxygen is released by heating. Further, the insulating film 108 is provided over the oxide semiconductor film 208. Accordingly, in the step of forming the insulating film 109, the insulating film 108 serves as a protective film for the oxide semiconductor film 208. Consequently, the insulating film 109 can be formed using the high-frequency power having a high power density while damage to the oxide semiconductor film 208 is reduced.

Note that in the film formation conditions for the insulating film 109, the flow rate of the deposition gas containing silicon relative to the oxidizing gas can be increased, whereby the amount of defects in the insulating film 109 can be reduced. Typically, it is possible to form an oxide insulating film in which the amount of defects is small, i.e., the spin density corresponding to a signal which appears at g=2.001 due to a dangling bond of silicon is lower than 6×10$^{17}$ spins/cm$^3$, preferably lower than or equal to 3×10$^{17}$ spins/cm$^3$, more preferably lower than or equal to 1.5×10$^{17}$ spins/cm$^3$ by ESR measurement. As a result, the reliability of the transistor can be improved.

In this embodiment, as the insulating film 109, a 400-nm-thick silicon oxynitride film is formed by a plasma. CVD method in which silane and dinitrogen monoxide are used as a source gas.

Next, second heat treatment is performed. The heat treatment is performed typically at a temperature of higher than or equal to 150° C. and lower than or equal to 400° C., preferably higher than or equal to 300° C. and lower than or equal to 400° C., more preferably higher than or equal to 320° C. and lower than or equal to 370° C.

An electric furnace, an RTA apparatus, or the like can be used for the second heat treatment. With the use of an RTA apparatus, the heat treatment can be performed at a temperature of higher than or equal to the strain point of the substrate if the heating time is short. Therefore, the heat treatment time can be shortened.

The second heat treatment may be performed under an atmosphere of nitrogen, oxygen, ultra-dry air (air with a water content of 20 ppm or less, preferably 1 ppm or less, more preferably 10 ppb or less), or a rare gas (argon, helium, or the like). The atmosphere of nitrogen, oxygen, ultra-dry air, or a rare gas preferably does not contain hydrogen, water, and the like.

By the second heat treatment, part of oxygen contained in the insulating film 109 can be moved to the oxide semiconductor film 208, so that oxygen vacancies contained in the oxide semiconductor film 208 can be reduced. Consequently, the amount of oxygen vacancies in the oxide semiconductor film 208 can be further reduced.

Further, in the case where water, hydrogen, or the like is contained in the insulating film 108 and the insulating film 109, when the insulating film 110 having a function of blocking water, hydrogen, and the like is formed later and heat treatment is performed, water, hydrogen, or the like contained in the insulating film 108 and the insulating film 109 is moved to the oxide semiconductor film 208, so that defects are generated in the oxide semiconductor film 208. However, by the heating, water, hydrogen, or the like contained in the insulating film 108 and the insulating film 109 can be released; thus, variation in electrical characteristics of the transistor can be reduced, and change in threshold voltage can be inhibited.

Note that when the insulating film 109 is formed over the insulating film 108 while being heated, oxygen can be moved to the oxide semiconductor film 208 and oxygen vacancies in the oxide semiconductor film 208 can be reduced; thus, the second heat treatment is not necessarily performed.

Here, heat treatment is performed at 350° C. for one hour in an atmosphere of a mixed gas of nitrogen and oxygen.

Further, when the source electrode 209a and the drain electrode 209b are formed, the oxide semiconductor film 208 is damaged by the etching of the conductive film 220, so that oxygen vacancies are generated on the back channel side of the oxide semiconductor film 208 (the side of the oxide semiconductor film 208 which is opposite the side facing the gate electrode 206). However, with the use of the oxide insulating film containing oxygen at a higher proportion than the stoichiometric composition as the insulating film 109, the oxygen vacancies generated on the back channel side can be repaired by heat treatment. By this, defects contained in the oxide semiconductor film 208 can be reduced, and thus, the reliability of the transistor can be improved.

[Removal of Part of Oxide Insulating Film]

Next, a mask is formed over the insulating film 109 by a photolithography process, and part of the insulating film 109 and the insulating film 108 is selectively etched. Thus, an opening 122 is formed over the oxide semiconductor film 209 (see FIG. 5C). At the same time, another opening which is not illustrated is also formed. The insulating film 109 and the insulating film 108 can be etched by a dry etching method, a wet etching method, or both a dry etching method and a wet etching method.

After that, second heat treatment may be performed. By the second heat treatment, part of oxygen contained in the insulating film 109 can be moved to the oxide semiconductor film 208 and the oxide semiconductor film 209, so that oxygen vacancies contained in the oxide semiconductor film 208 and the oxide semiconductor film 209 can be reduced.

[Formation of Protective Film]

Next, the insulating film 110 is formed (see FIG. 6A). It is possible to prevent outward diffusion of oxygen from the oxide semiconductor film 208, the insulating film 108, and the insulating film 109 by using an insulating film having a blocking effect against oxygen, hydrogen, water, alkali metal, alkaline earth metal, and the like as the insulating film 110. It is also possible to prevent entry of an impurity such as hydrogen or water into the oxide semiconductor film 208 from the outside. Examples of such an insulating film include nitride insulating films and oxide insulating films such as a silicon nitride film, a silicon nitride oxide film, an aluminum nitride film, an aluminum nitride oxide film, an aluminum oxide film, an aluminum oxynitride film, a gallium oxide film, a gallium oxynitride film, an yttrium oxide film, an yttrium oxynitride film, a hafnium oxide film, and a hafnium oxynitride film.

Note that the structure of the insulating film 110 is not limited to the above-described structure. A single layer or a stacked layer of a plurality of oxide insulating films and nitride insulating films can be used as appropriate.

In this embodiment, a silicon nitride film containing hydrogen is formed as the insulating film 110.

The oxide semiconductor film 209 is in contact with the insulating film 110 in the opening 122. Thus, hydrogen contained in the insulating film 110 is diffused into the oxide semiconductor film 209 in the opening 122 and bonded to oxygen contained in the oxide semiconductor film 209, whereby electrons serving as carriers are generated. Further, when the insulating film 110 is formed by a plasma CVD method or a sputtering method, the oxide semiconductor film 209 in the opening 122 is exposed to plasma, so that oxygen vacancies are generated in the oxide semiconductor film 209. When hydrogen contained in the insulating film 110 enters the oxygen vacancies, electrons serving as carriers are generated. As a result, the conductivity of the oxide semiconductor film 209 is increased, so that the oxide semiconductor film 209 becomes a conductive oxide semiconductor film 209. In other words, the conductive oxide semiconductor film 209 can be referred to as an oxide semiconductor film with high conductivity or a metal oxide film with high conductivity.

Note that when the oxide semiconductor film 209 is exposed to plasma containing a rare gas and hydrogen before the insulating film 110 is formed, oxygen vacancies can be formed in the oxide semiconductor film 209 and hydrogen can be added to the oxide semiconductor film 209. As a result, electrons serving as carriers can be further increased in the oxide semiconductor film 209, and the conductivity of the conductive oxide semiconductor film 209 can be further increased.

The conductive oxide semiconductor film 209 is a film containing a metal element similar to that of the oxide semiconductor film 208 and contains impurities. An example of the impurities is hydrogen. As the impurity other than hydrogen, boron, phosphorus, tin, antimony, a rare gas element, alkali metal, alkaline earth metal, or the like may be included.

Both the oxide semiconductor film 208 and the conductive oxide semiconductor film 209 are formed over the gate insulating film 207 but differ in impurity concentration. Specifically, the conductive oxide semiconductor film 209 has a higher impurity concentration than the oxide semiconductor film 208. For example, the concentration of hydrogen contained in the oxide semiconductor film 208 is lower than $5 \times 10^{19}$ atoms/cm$^3$, preferably lower than $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$, yet more preferably lower than or equal to $1 \times 10^{16}$ atoms/cm$^3$. The concentration of hydrogen contained in the conductive oxide semiconductor film 209 is higher than or equal to $8 \times 10^{19}$ atoms/cm$^3$, preferably higher than or equal to $1 \times 10^{20}$ atoms/cm$^3$, more preferably higher than or equal to $5 \times 10^{20}$ atoms/cm$^3$. The concentration of hydrogen contained in the conductive oxide semiconductor film 209 is greater than or equal to 2 times, preferably greater than or equal to 10 times that in the oxide semiconductor film 208.

The conductive oxide semiconductor film 209 has lower resistivity than the oxide semiconductor film 208. The resistivity of the oxide semiconductor film 208 is preferably greater than or equal to $1 \times 10^1$ times and less than $1 \times 10^8$ times the resistivity of the conductive oxide semiconductor film 209. The resistivity of the conductive oxide semiconductor film 209 is typically greater than or equal to $1 \times 10^{-3}$ Ωcm and less than $1 \times 10^4$ Ωcm, preferably greater than or equal to $1 \times 10^{-3}$ Ωcm and less than $1 \times 10^{-1}$ Ωcm.

Note that one embodiment of the present invention is not limited thereto, and it is possible that the conductive oxide semiconductor film 209 be not in contact with the insulating film 110 depending on circumstances.

Further, one embodiment of the present invention is not limited thereto, and the conductive oxide semiconductor film 209 may be formed by a different process from that of the oxide semiconductor film 208. In that case, the conductive oxide semiconductor film 209 may include a different material from that of the oxide semiconductor film 208. For example, the conductive oxide semiconductor film 209 may be formed using indium tin oxide, indium oxide containing tungsten oxide, indium zinc oxide containing tungsten oxide, indium oxide containing titanium oxide, indium tin oxide containing titanium oxide, indium tin oxide, indium zinc oxide, indium tin oxide containing silicon oxide, or the like.

In the display device illustrated in this embodiment, one electrode of the capacitor is formed at the same time as the semiconductor film of the transistor. In addition, a light-transmitting conductive film that serves as a pixel electrode is used as the other electrode of the capacitor. Thus, a step of forming another conductive film is not needed to form the capacitor, and the number of steps of manufacturing the semiconductor device can be reduced. Further, since the pair of electrodes of the capacitor has a light-transmitting property, the capacitor has a light-transmitting property. As a result, the area occupied by the capacitor can be increased and the aperture ratio in a pixel can be increased.

Next, part of the insulating film 110, the insulating film 109, and the insulating film 108 is selectively etched. Thus, an opening 142 is formed. At the same time, another opening which is not illustrated is also formed. The opening 142 and the like can be formed in such a manner that a resist mask is formed by a photolithography process and a region not covered with the resist mask is etched (see FIG. 6B). At the bottom of the opening 142, a surface of the source electrode 209a is exposed.

Note that the insulating film 110, the insulating film 109, and the insulating film 108 can be etched using a dry etching method, for example. Note that the etching method is not limited thereto, and a wet etching method or a combination of a dry etching method and a wet etching method may be used.

[Formation of Conductive Film]

Next, a conductive film for forming the conductive film 145 is formed over the insulating film 110 so as to cover the opening 122. A resist mask is formed over the conductive film by a photolithography process, and a region not covered with the resist mask is etched to form the conductive film 145 (see FIG. 7A).

At the same time the conductive film 145 is formed, an electrode 226 can be formed in a region overlapping with the gate electrode 206 and the oxide semiconductor film 208. The conductive film 145 and the electrode 226 can be formed using a material and a method similar to those of the gate electrode 206.

When the conductive film 145 is formed using a light-transmitting conductive material, the capacitor 232 can have a light-transmitting property. In this embodiment, 100-nm-thick indium tin oxide is used for the conductive film 145 and the electrode 226 (see FIG. 7A).

The electrode 226 can also serve as a gate electrode. In the case where one of the gate electrode 206 and the electrode 226 is simply referred to as a "gate electrode", the other is referred to as a "back gate electrode" in some cases. One of the gate electrode 206 and the electrode 226 is referred to as a "first gate electrode", and the other is referred to as a "second gate electrode" in some cases.

In general, the back gate electrode is formed using a conductive film and positioned so that the channel formation region of the semiconductor layer is positioned between the gate electrode and the back gate electrode. Thus, the back gate electrode can function in a manner similar to that of the gate electrode. The potential of the back gate electrode may be the same as that of the gate electrode or may be a GND potential or a predetermined potential. By changing a potential of the back gate electrode, the threshold voltage of the transistor can be changed.

Furthermore, the gate electrode and the back gate electrode are formed using conductive films and thus each have a function of preventing an electric field generated outside the transistor from influencing the semiconductor layer in which the channel is formed (in particular, a function of blocking static electricity).

In the case where light is incident on the back gate electrode side, when the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

By providing the gate electrode 206 and the electrode 226 so that the oxide semiconductor film 208 is located therebetween, and by setting the potentials of the gate electrode 206 and the electrode 226 to be the same, a region of the oxide semiconductor film 208 through which carriers flow is enlarged in the film thickness direction; thus, the number of transferred carriers is increased. As a result, the on-state current and the field-effect mobility of the transistor are increased.

The gate electrode 206 and the electrode 226 each have a function of blocking an external electric field; thus, charges in a layer under the gate electrode 206 and in a layer over the electrode 226 do not affect the oxide semiconductor film 208. Thus, there is little change in the threshold voltage in a stress test (e.g., a negative gate bias temperature (−GBT) stress test in which a negative voltage is applied to a gate or a +GBT stress test in which a positive voltage is applied to a gate). In addition, changes in the rising voltages of on-state current at different drain voltages can be suppressed. Note that this effect is caused when the gate electrode 206 and the electrode 226 have the same potential or different potentials.

The BT stress test is one kind of accelerated test and can evaluate, in a short time, a change in characteristics (i.e., a change over time) of transistors, which is caused by long-term use. In particular, the amount of change in threshold voltage of the transistor in the BT stress test is an important indicator when examining the reliability of the transistor. As the amount of change in the threshold voltage in the BT stress test is small, the transistor has higher reliability.

By providing the gate electrode 206 and the electrode 226 and setting the potentials of the gate electrode 206 and the electrode 226 to be the same, the amount of change in the threshold voltage is reduced. Accordingly, variation in electrical characteristics among a plurality of transistors is also reduced.

[Formation of Planarization Film]

Next, the insulating film 211 is formed over the conductive film 145. The insulating film 211 can be formed using a material and a method similar to those of the insulating film 205.

Planarization treatment may be performed on the insulating film 211 to reduce unevenness of a surface on which the light-emitting element 125 is formed. The planarization treatment may be, but not particularly limited to, polishing treatment (e.g., chemical mechanical polishing (CMP)) or dry etching treatment.

Forming the insulating film 211 using an insulating material with a planarization function can omit polishing treatment. As the insulating material with a planarization function, for example, an organic material such as a polyimide resin or an acrylic resin can be used. Other than the above-described organic materials, it is also possible to use a low-dielectric constant material (low-k material) or the like. Note that the insulating film 211 may be formed by stacking a plurality of insulating films formed of these materials.

Part of the insulating film 211 in a region overlapping with the opening 142 is removed to form an opening 143. At the same time, another opening which is not illustrated is also formed. In addition, the insulating film 211 in a region where the external electrode 124 is connected later is also removed. The opening 143 or the like can be formed in such a manner that a resist mask is formed by a photolithography process over the insulating film 211 and a region of the insulating film 211 which is not covered with the resist mask is etched (see FIG. 7B). By formation of the opening 143, the surface of the source electrode 209a is exposed.

When the insulating film 211 is formed using a photosensitive material, the opening 143 can be formed without the resist mask. In this embodiment, a photosensitive polyimide resin is used to form the insulating film 211 and the opening 143.

[Formation of Anode]

Figure 8A:
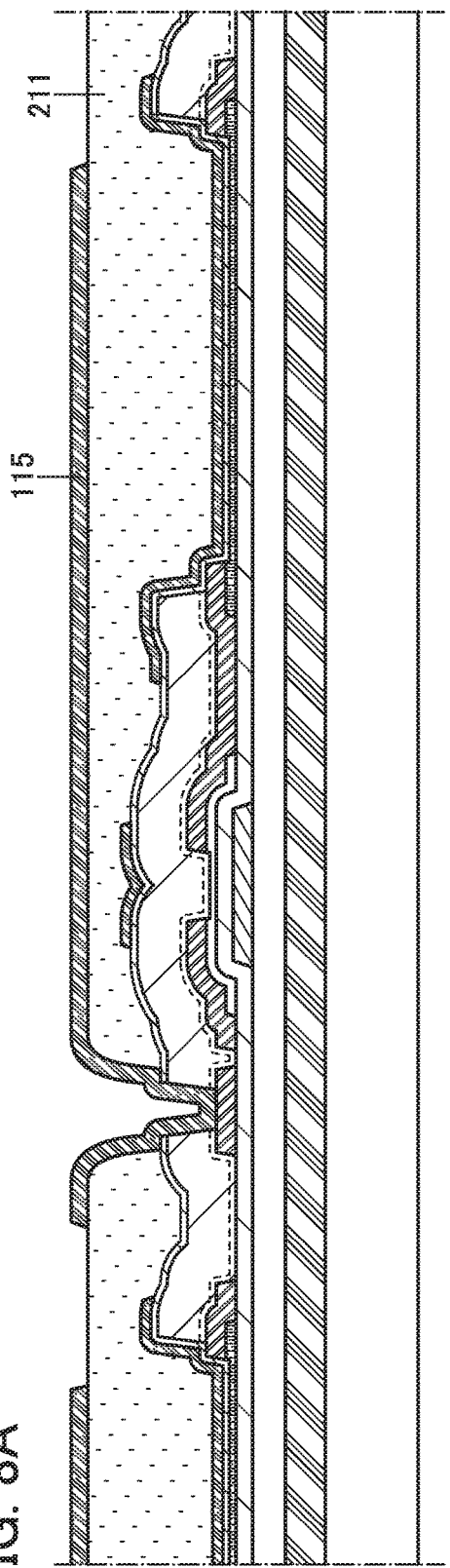
FIGS. 8A and 8B are cross-sectional views illustrating one embodiment of a method for manufacturing a display device.
Figure 8B:
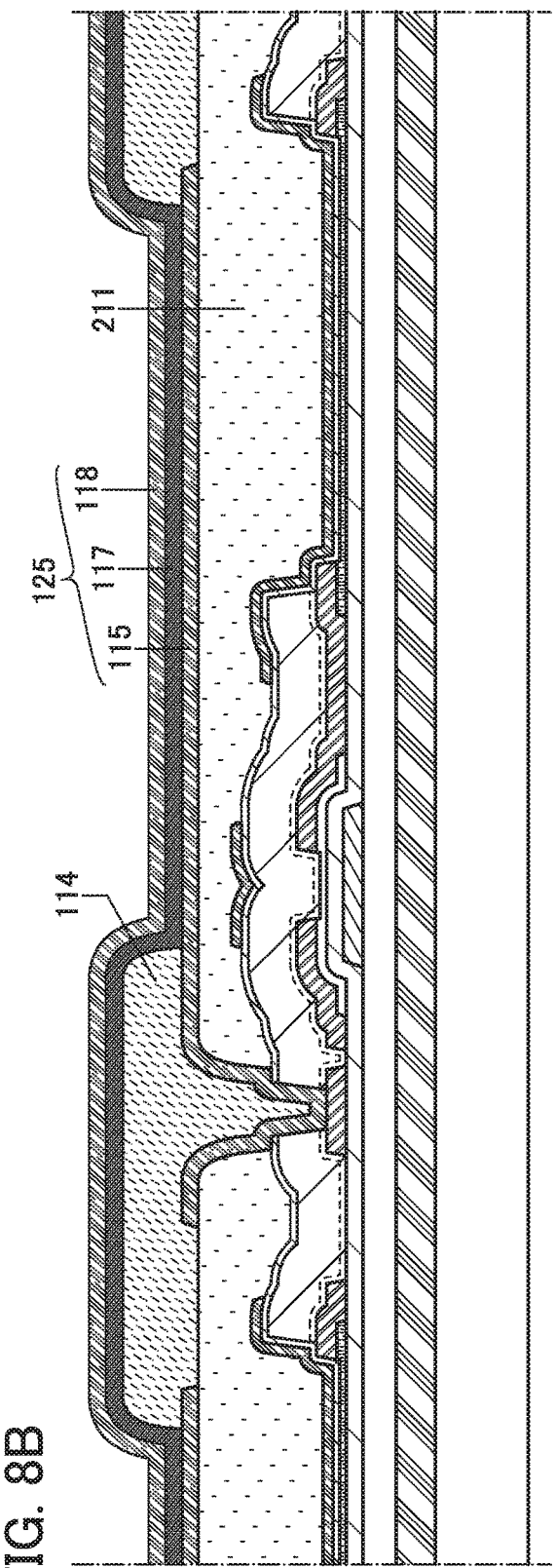

Next, the electrode 115 is formed over the insulating film 211 (see FIG. 8A). The electrode 115 is preferably formed using a conductive material that efficiently reflects light emitted from the EL layer 117 formed later. Note that the electrode 115 may have a stacked-layer structure of a plurality of layers without limitation to a single-layer structure. For example, in the case where the electrode 115 is used as an anode, a layer in contact with the EL layer 117 may be a light-transmitting layer, such as an indium tin oxide layer, having a work function higher than that of the EL layer 117, and a layer having high reflectance (e.g., aluminum, an alloy containing aluminum, or silver) may be provided in contact with the layer.

Note that although the display device having a top-emission structure is described as an example in this embodiment, a display device having a bottom-emission structure or a dual-emission structure may be used.

In the case of a display device having a bottom-emission structure or a dual-emission structure, the electrode 115 may be formed using a light-transmitting conductive material.

The electrode 115 can be formed by forming a conductive film to be the electrode 115 over the insulating film 211, forming a resist mask by a photolithography process, and etching a region of the conductive film which is not covered with the resist mask. The conductive film can be etched by a dry etching method, a wet etching method, or both a dry etching method and a wet etching method.

[Formation of Partition]

Next, the partition 114 is formed. The partition 114 is provided to prevent an unintentional electric short-circuit between adjacent light-emitting elements 125 and unintended light emission therefrom. In the case of using a metal mask for formation of the EL layer 117 described later, the partition 114 has a function of preventing the contact of the metal mask with the electrode 115. The partition 114 can be formed of an organic resin material such as an epoxy resin, an acrylic resin, or an imide resin or an inorganic material such as silicon oxide. The partition 114 is preferably formed so that its sidewall has a tapered shape or a tilted surface with a continuous curvature. The sidewall of the partition 114 having the above-described shape enables favorable coverage with the EL layer 117 and the electrode 118 formed later.

[Formation of EL Layer]

A structure of the EL layer 117 is described in Embodiment 7.

[Formation of Cathode]

The electrode 118 is used as a cathode in this embodiment, and thus is preferably formed using a material that has a low work function and can inject electrons into the EL layer 117 described later. As well as a single-layer of a metal having a low work function, a stack in which a metal material such as aluminum, a conductive oxide material such as indium tin oxide, or a semiconductor material is formed over a several-nanometer-thick buffer layer formed of an alkali metal or an alkaline earth metal having a low work function may be used as the electrode 118. As the buffer layer, an oxide of an alkaline earth metal, a halide, a magnesium-silver alloy, or the like can also be used.

In the case where light emitted from the EL layer 117 is extracted through the electrode 118, the electrode 118 preferably has a property of transmitting visible light. The light-emitting element 125 includes the electrode 115, the EL layer 117, and the electrode 118.

[Formation of Counter Substrate]

Figure 9:
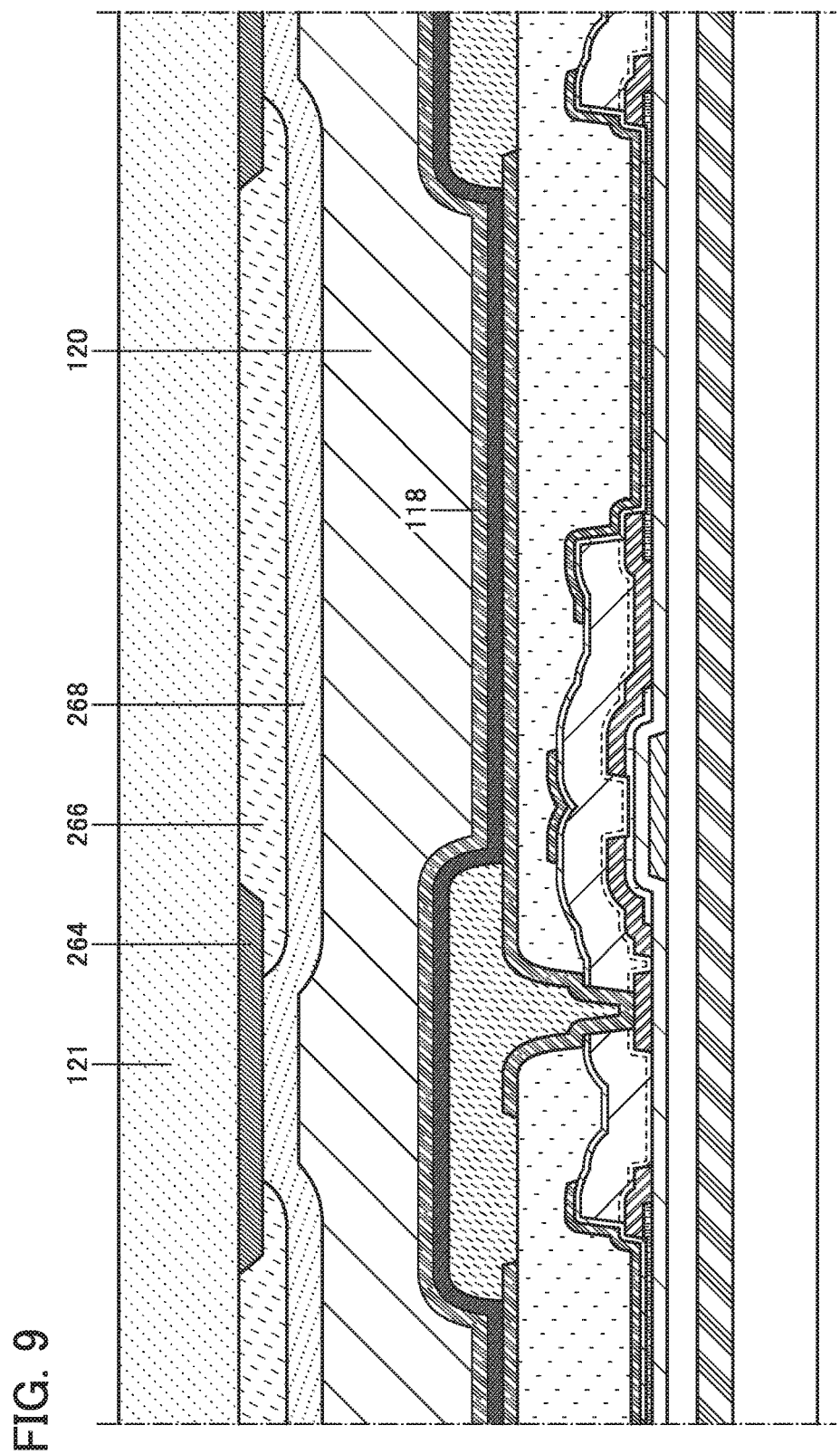
FIG. 9 is a cross-sectional view illustrating one embodiment of a method for manufacturing a display device.

The substrate 121 provided with the light-blocking film 264, the coloring layer 266, and the overcoat layer 268 (hereinafter simply also referred to as "substrate 121") is placed over the electrode 118 with the bonding layer 120 provided therebetween (see FIG. 9). Note that a structure of the substrate 121 is described later.

The bonding layer 120 is in contact with the electrode 118. The substrate 121 is fixed by the bonding layer 120. A light curable adhesive, a reactive curable adhesive, a thermosetting adhesive, or an anaerobic adhesive can be used as the bonding layer 120. For example, an epoxy resin, an acrylic resin, an imide resin, or the like can be used. A drying agent (e.g., zeolite) having a size less than or equal to the wavelength of light or a filler (e.g., titanium oxide or zirconium) with a high refractive index is preferably mixed into the bonding layer 120 in the case of a top-emission structure, in which case the efficiency of extracting light emitted from the EL layer 117 can be improved.

[Separation of Element Formation Substrate]

Figure 10:
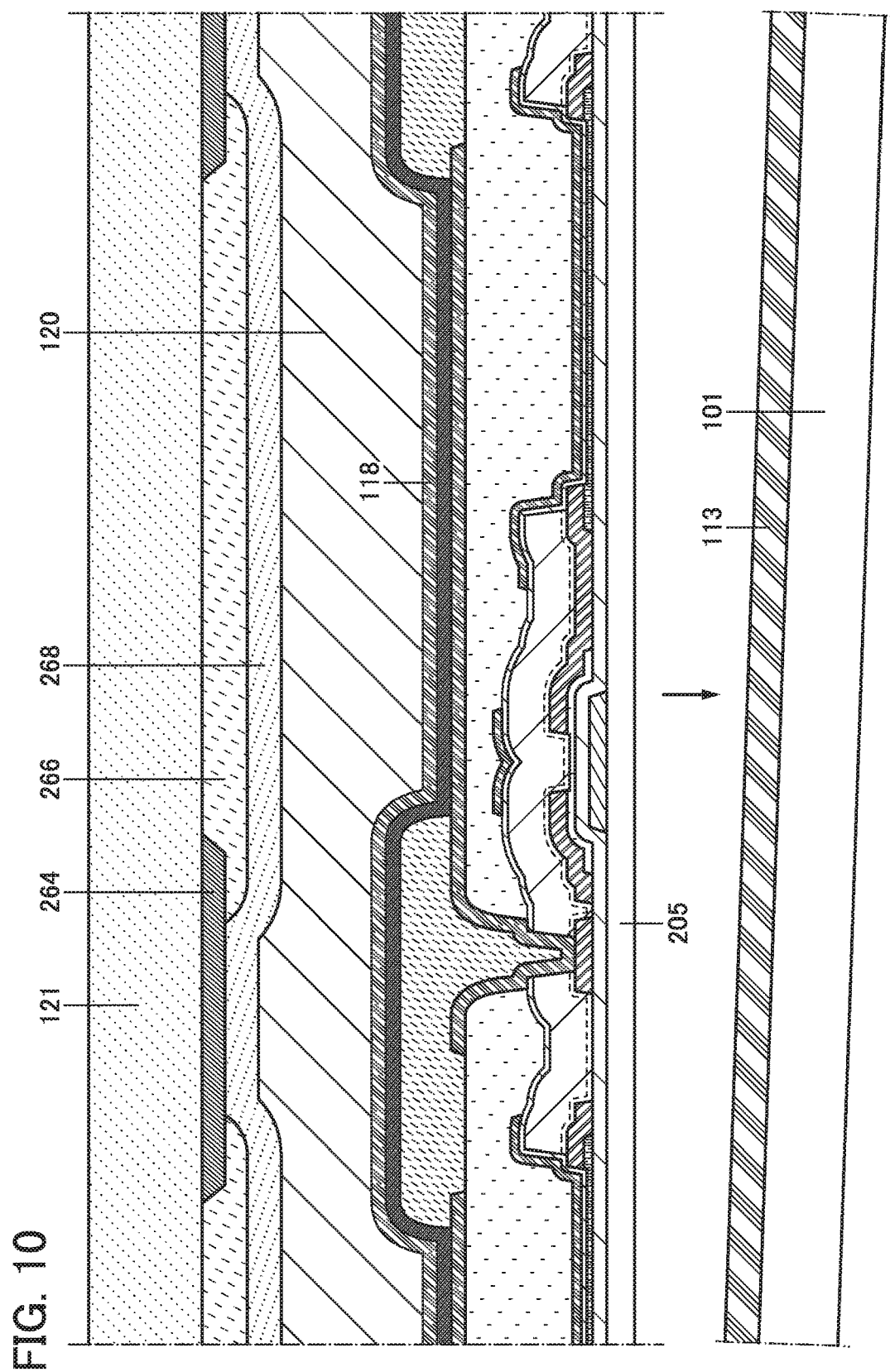
FIG. 10 is a cross-sectional view illustrating one embodiment of a method for manufacturing a display device.

Next, the element formation substrate 101 attached to the insulating film 205 with the separation layer 113 provided therebetween is separated from the insulating film 205 (see FIG. 10). As a separation method, mechanical force (a separation process with a human hand or a gripper, a separation process by rotation of a roller, ultrasonic waves, or the like) may be used. For example, a cut is made in the separation layer 113 with a sharp edged tool, by laser light irradiation, or the like and water is injected into the cut. Alternatively, the cut is sprayed with a mist of water. A portion between the separation layer 113 and the base layer 119 absorbs water through capillarity action, so that the element formation substrate 101 can be separated easily.

[Bonding of Substrate]

Figure 11:
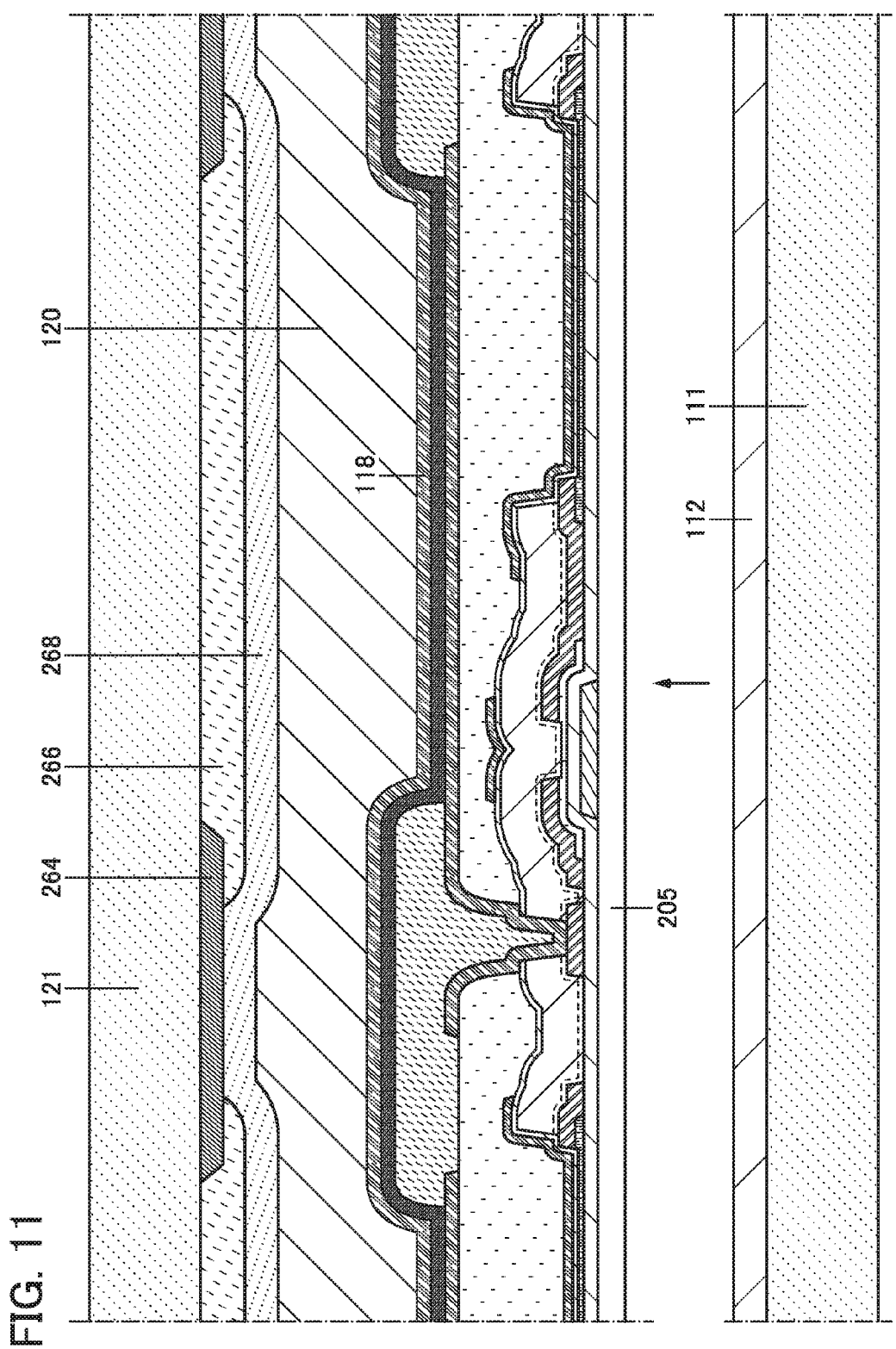
FIG. 11 is a cross-sectional view illustrating one embodiment of a method for manufacturing a display device.

Next, the substrate 111 is attached to the insulating film 205 with the bonding layer 112 provided therebetween (see FIG. 11). In the above-described manner, the display device 100 can be manufactured. The bonding layer 112 can be formed using a material similar to that of the bonding layer 120.

In the above-described manner, the display device 100 can be manufactured.

In the display device 100 described in this embodiment, part of the insulating film 108 and the insulating film 109 is removed from a region not overlapping with the transistor 431 and the transistor 233. The removal of the part of the insulating film 108 and the insulating film 109 makes the display device 100 easily bendable. Thus, a highly flexible display device can be obtained. One embodiment of the present invention can provide a highly reliable display device which is not easily broken even when a bending operation is repeated.

[Structure of Counter Substrate]

Next, a structure that is formed over the substrate 121 provided so as to face the substrate 111 is described below.

First, the substrate 121 is prepared. For the substrate 121, a material similar to that of the substrate 111 can be used. Then, the light-blocking film 264 is formed over the substrate 121 (see FIG. 12A). After that, the coloring layer 266 is formed (see FIG. 12B).

The light-blocking film 264 and the coloring layer 266 each are formed in a desired position with any of various materials by a printing method, an inkjet method, a photolithography method, or the like.

Figure 12A:
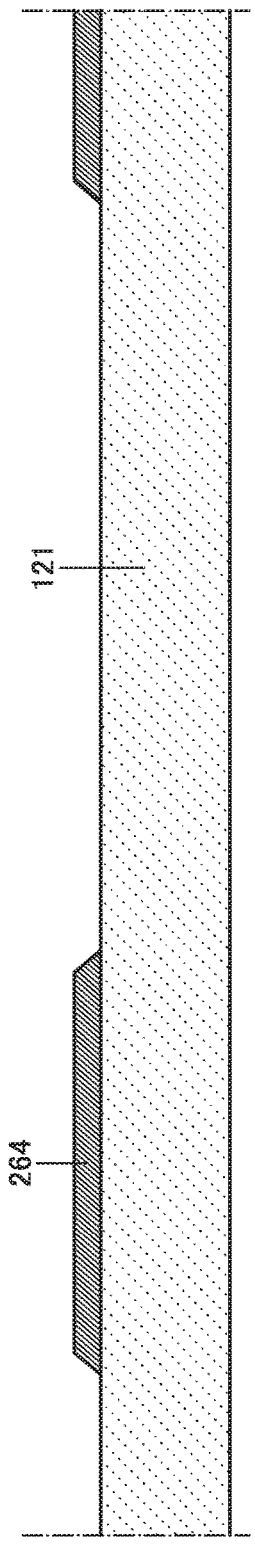
FIGS. 12A to 12C are cross-sectional views illustrating one embodiment of a method for manufacturing a display device.
Figure 12B:
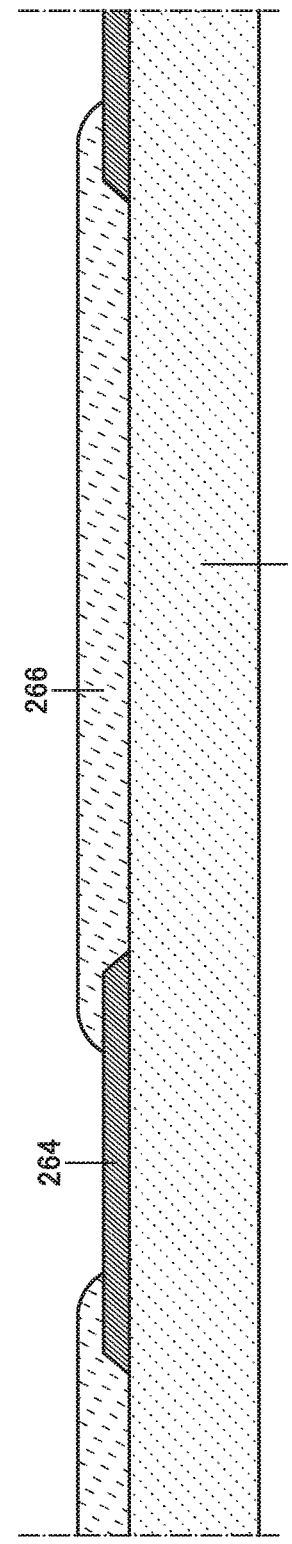
Figure 12C:
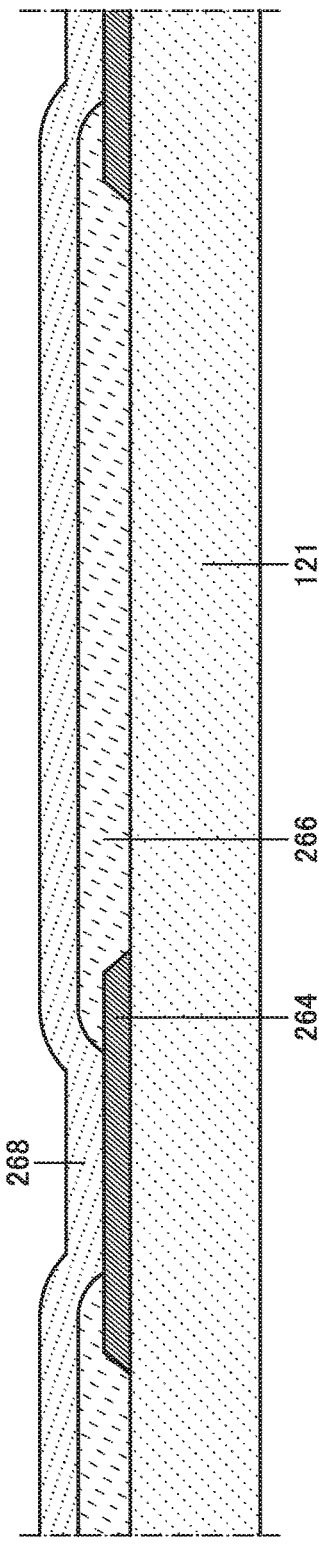

Next, the overcoat layer 268 is formed over the light-blocking film 264 and the coloring layer 266 (see FIG. 12C).

For the overcoat layer 268, an organic insulating film of an acrylic resin, an epoxy resin, polyimide, or the like can be used. With the overcoat layer 268, an impurity or the like contained in the coloring layer 266 can be prevented from diffusing into the light-emitting element 125 side, for example. Note that the overcoat layer 268 is not necessarily formed.

Through the above process, the structure formed over the substrate 121 can be formed.

[Film Formation Method]

Although the variety of films such as the metal films, the semiconductor films, and the inorganic insulating films which are described in this embodiment can be formed by a sputtering method or a plasma chemical vapor deposition (CVD) method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to a chamber at a time, the pressure in the chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated a plurality of times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the metal film, the semiconductor film, and the inorganic insulating film which are described in this embodiment can be formed by a thermal CVD method such as a MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. Note that the chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed using a deposition apparatus employing ALD, two kinds of gases, i.e., ozone ($O_3$) as an oxidizer and a source gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamine)hafnium.

For example, in the case where an aluminum oxide film is formed using a deposition apparatus employing ALD, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(di methylamide)aluminum, triisobutylaluminum, and aluminum tris(2,2,6,6-tetramethyl-3,5-heptanedioate).

For example, in the case where a silicon oxide film is formed using a deposition apparatus employing ALD, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced a plurality of times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced a plurality of tunes to form an In—O layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Further, instead of an $In(CH_3)_3$ gas, an $In(C_2H_5)_3$ gas may be used. Furthermore, a $Zn(CH_3)_2$ gas may be used.

The structures, methods, and the like described in this embodiment can be used as appropriate in combination with any of the structures, methods, and the like described in other embodiments.

Embodiment 2

A display device 150 having a bottom-emission structure can be manufactured by modification of the structure of the display device 100 having a top-emission structure.

Figure 13:
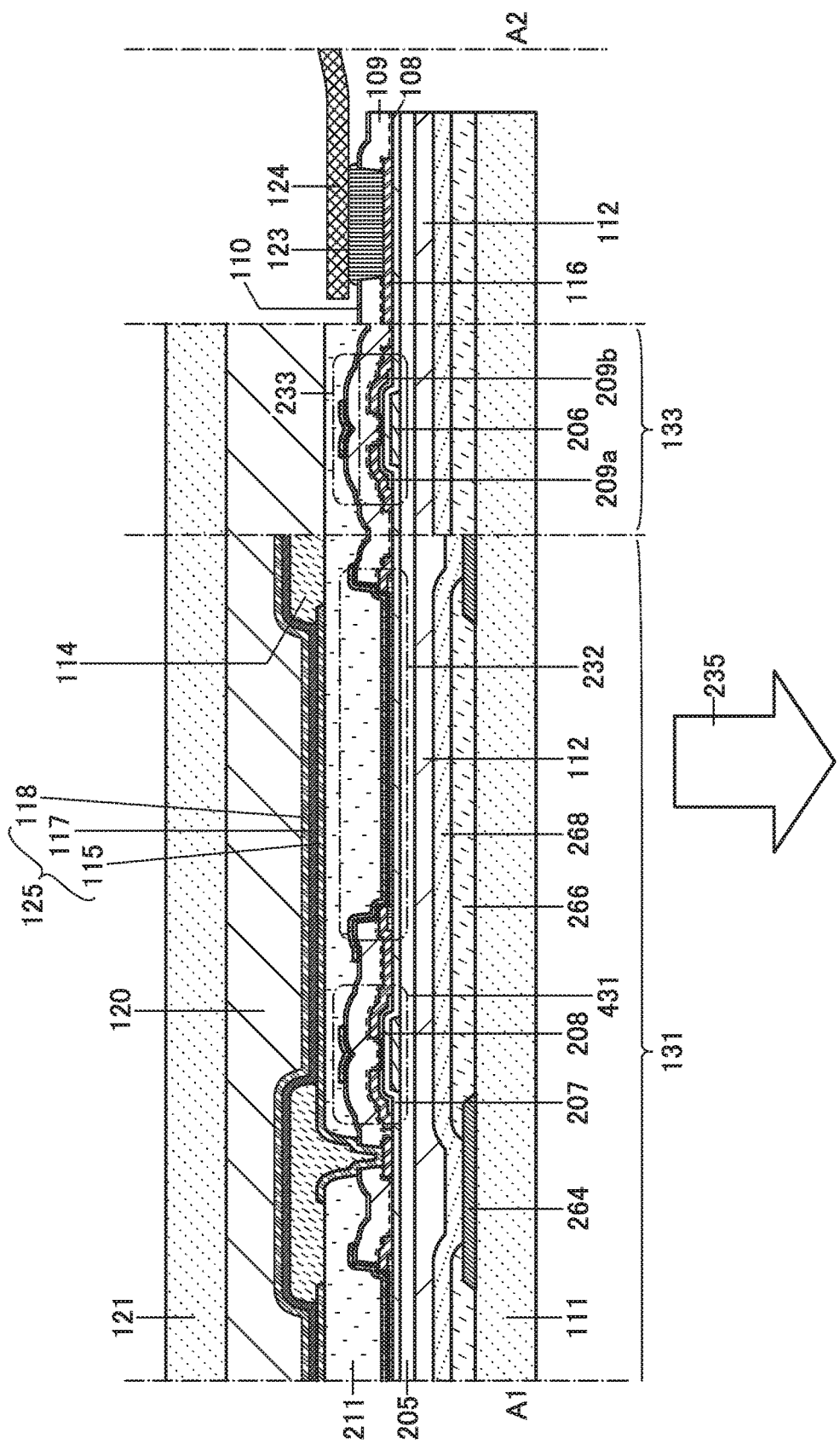
FIG. 13 is a cross-sectional view illustrating one embodiment of a display device.

FIG. 13 illustrates a cross-sectional structural example of the display device 150 having a bottom-emission structure. Note that FIG. 13 is a cross-sectional view of a portion similar to the portion denoted by the dashed-dotted line A1-A2 in FIG. 1A that is a perspective view of the display device 100. The display device 150 having a bottom-emission structure differs from the display device 100 in the position where the light-blocking film 264, the coloring layer 266, and the overcoat layer 268 are formed.

In the display device 150, the light-blocking film 264, the coloring layer 266, and the overcoat layer 268 are formed over the substrate 111.

In the display device 150 having a bottom-emission structure, the electrode 115 is formed using a light-transmitting conductive material, and the electrode 118 is formed using a conductive material which efficiently reflects light emitted from the EL layer 117.

In the display device 150, light 235 emitted from the EL layer 117 can be extracted from the substrate 111 side through the coloring layer 266.

Figure 23:
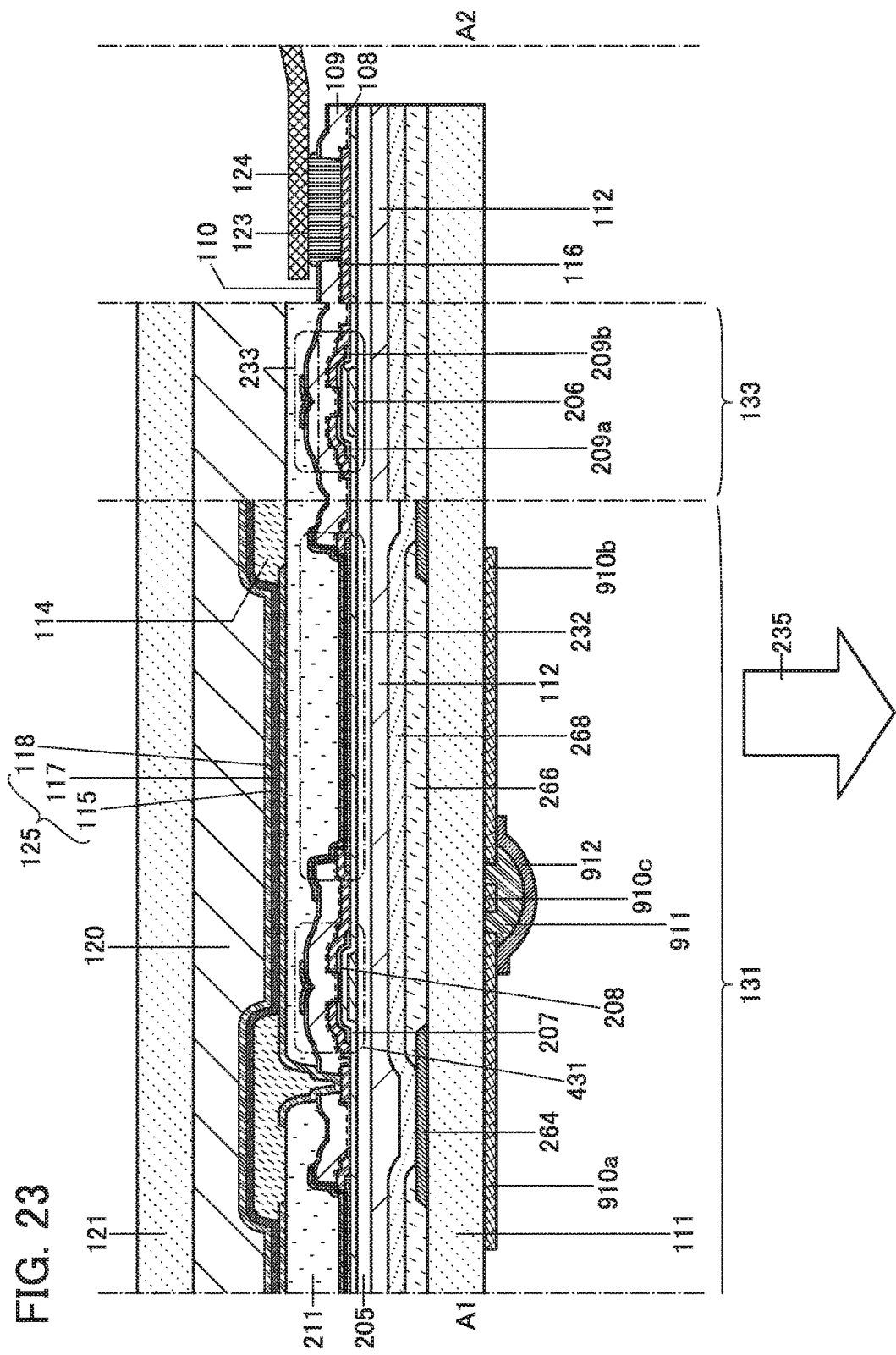
FIG. 23 is a cross-sectional view illustrating one embodiment of a display device.
Figure 24:
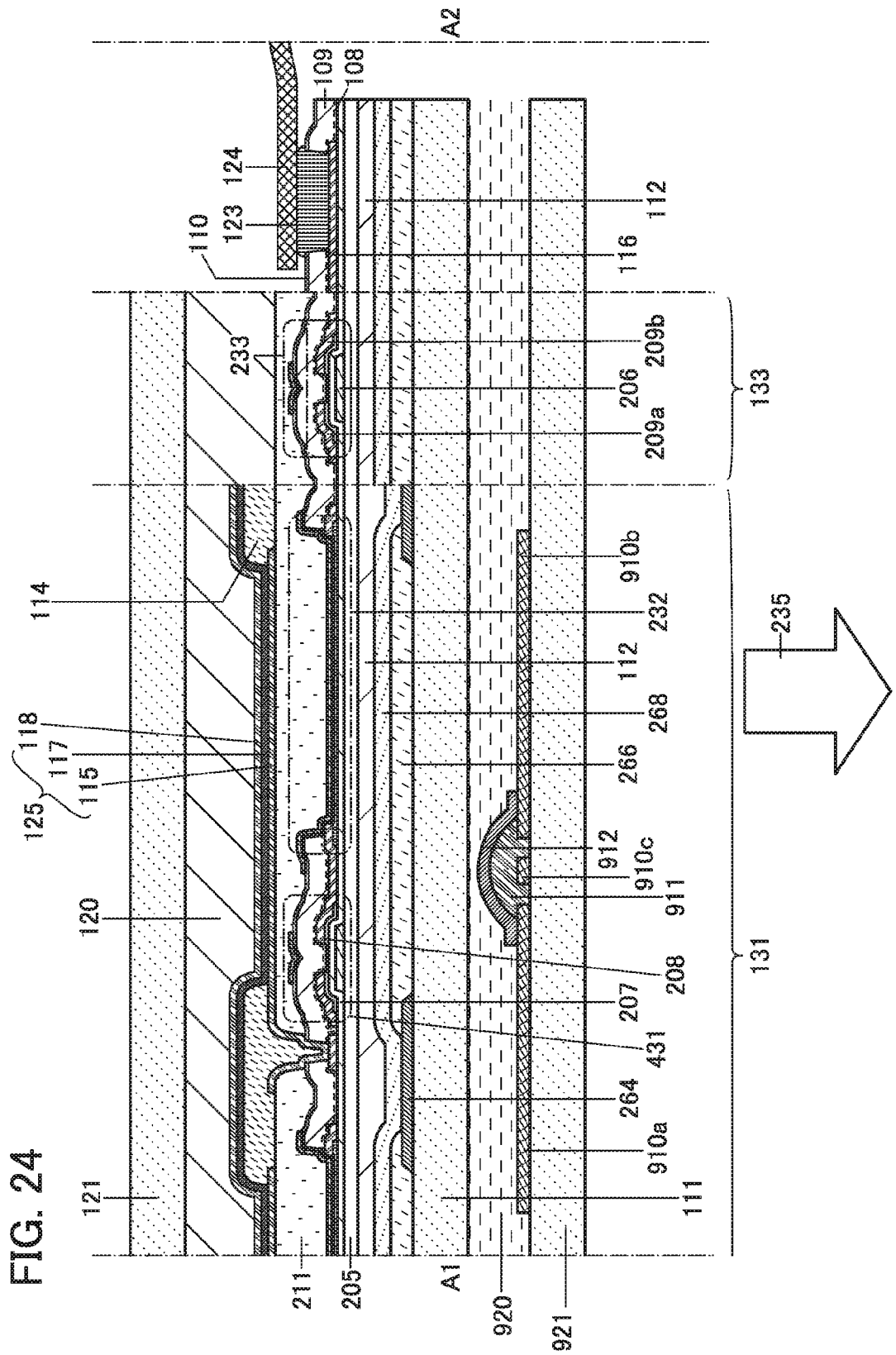
FIG. 24 is a cross-sectional view illustrating one embodiment of a display device.

Note that the substrate 111 can be provided with a touch sensor as illustrated in FIG. 23 and as provided in FIG. 21. The substrate 921 can also be provided with a touch sensor as illustrated in FIG. 24 and as provided in FIG. 22.

The structures, methods, and the like described in this embodiment can be used as appropriate in combination with any of the structures, methods, and the like described in other embodiments.

Embodiment 3

With a combination of the display device 100 and the display device 150, it is possible to obtain a display device having a dual-emission structure in which the light 235 emitted from the EL layer 117 is extracted from both the substrate 111 side and the substrate 121 side.

Note that in the case of the display device having a dual-emission structure, both the electrode 115 and the electrode 118 may be formed using a light-transmitting conductive material.

The structures, methods, and the like described in this embodiment can be used as appropriate in combination with any of the structures, methods, and the like described in other embodiments.

Embodiment 4

In this embodiment, the structure of the transistor 431 described in the above embodiment is described. FIGS. 14A to 14C illustrate a top view and cross-sectional views of the transistor 431 as an example of a semiconductor device. The transistor 431 is a channel-etched transistor. Note that the transistor 233 and the transistor 231 can also have a structure similar to that of the transistor 431.

FIG. 14A is a top view of the transistor 431. FIG. 14B is a cross-sectional view of a portion denoted by a dashed-dotted line X1-X2 in FIG. 14A, and FIG. 14C is a cross-sectional view of a portion denoted by a dashed-dotted line Y1-Y2 in FIG. 14A. Note that FIG. 14B illustrates a cross-section in a channel length direction of the transistor 431, and FIG. 14C illustrates a cross-section in a channel width direction of the transistor 431.

The transistor 431 includes the gate electrode 206, the gate insulating film 207, the oxide semiconductor film 208 overlapping with the gate electrode 206 with the gate insulating film 207 positioned therebetween, and the source electrode 209a and the drain electrode 209b in contact with the oxide semiconductor film 208. A protective film 141 including the insulating film 108, the insulating film 109, and the insulating film 110 is formed over the gate insulating film 2017, the oxide semiconductor film 208, and the source electrode 209a and the drain electrode 209b. The electrode 226 overlapping with the oxide semiconductor film 208 is provided over the insulating film 110.

The transistor 431 has a dual-gate structure in which a plurality of gate electrodes are included and the oxide semiconductor film 208 is provided between the plurality of gate electrodes. In the channel width direction in FIG. 14C, an end portion of the electrode 226 is positioned on the outer side of the oxide semiconductor film 208. Alternatively, in the channel width direction, the electrode 226 is provided so as to extend beyond an end portion of the oxide semiconductor film 208 with the protective film 141 positioned therebetween. Furthermore, in the channel width direction, the gate electrode 206 faces the electrode 226 on the outer side of the oxide semiconductor film 208 with the gate insulating film 207 and the protective film 141 positioned therebetween.

The positions of end portions of the gate electrode 206, the oxide semiconductor film 208, and the electrode 226 are described with reference to FIG. 14C.

When the distance between the end portion of the oxide semiconductor film 208 and the end portion of the electrode 226 is referred to as a distance d and the thickness of the protective film 141 is referred to as a thickness t, the distance d is preferably smaller than or equal to the thickness t. The distance d is made smaller than or equal to the thickness 1, whereby an electric field of the electrode 226 can exert an influence on the end portion of the oxide semiconductor film 208 and thus the whole oxide semiconductor film 208 including its end portion can serve as a channel.

Defects are formed at the end portion of the oxide semiconductor film 208 processed by etching or the like because of damage due to the processing, and the end portion of the oxide semiconductor film 208 is contaminated by attachment of impurities, or the like. Thus, when stress such as an electric field is applied, the end portion of the oxide semiconductor film 208 is easily activated. In other words, the end portion of the oxide semiconductor film processed by etching or the like easily becomes n-type (has lower resistance).

When such an unintentional n-type region is in contact with the source electrode 209a and the drain electrode 209b, an unintentional current (also referred to as "leakage current") flows between the source electrode 209a and the drain electrode 209b through the region. In other words, the region serves as a parasitic channel.

However, as illustrated in FIG. 14C, when the end portion of the gate electrode 206 is positioned on the outer side of the oxide semiconductor film 208, generation of a parasitic channel at the side surface of the oxide semiconductor film 208 or in the end portion including the side surface and its vicinity is suppressed because of an electric field of the gate electrode 206. As a result, the transistor has excellent electrical characteristics with which drain current is drastically increased when the gate voltage exceeds the threshold voltage.

The structures, methods, and the like described in this embodiment can be used as appropriate in combination with any of the structures, methods, and the like described in other embodiments.

Embodiment 5

In this embodiment, a structure of a transistor 200 which can be used as the transistor 231, the transistor 233, the transistor 431, and the like is described with reference to FIGS. 15A to 15C.

Figure 15A:
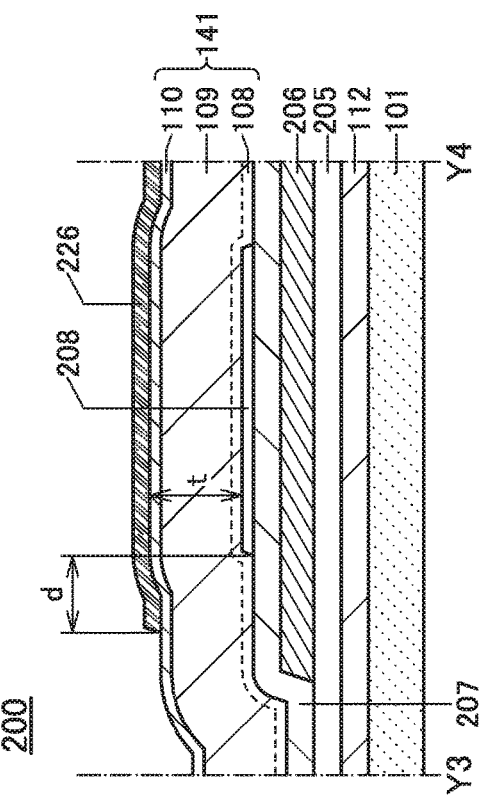
FIGS. 15A to 15C illustrate one embodiment of a transistor.

FIG. 15A is a top view of the transistor 200. FIG. 15B is a cross-sectional view of a portion denoted by a dashed-dotted line X3-X4 in FIG. 15A, and FIG. 15C is a cross-sectional view of a portion denoted by a dashed-dotted line Y3-Y4 in FIG. 15A. Note that FIG. 15B illustrates a cross-section in a channel length direction of the transistor 200, and FIG. 15C illustrates a cross-section in a channel width direction of the transistor 200.

The transistor 200 can be manufactured in a manner similar to that of the transistor 431 described in the above embodiment. Note that the transistor 200 differs from the transistor 431 in the shapes of the oxide semiconductor film 208 and the gate electrode 206.

Figure 15B:
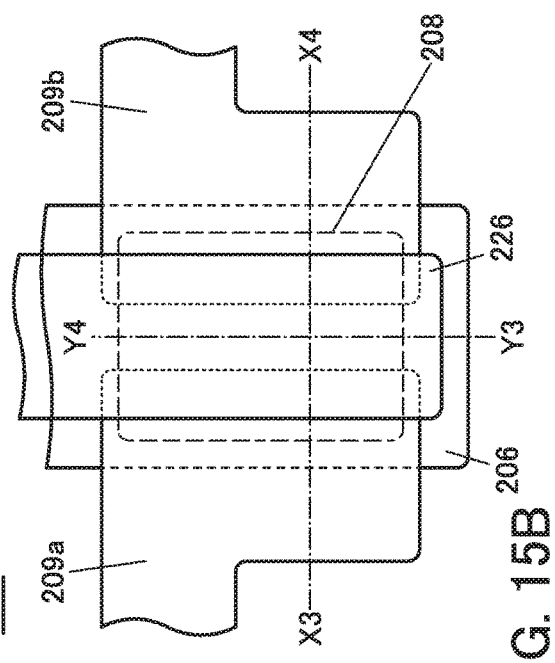
Figure 15C:
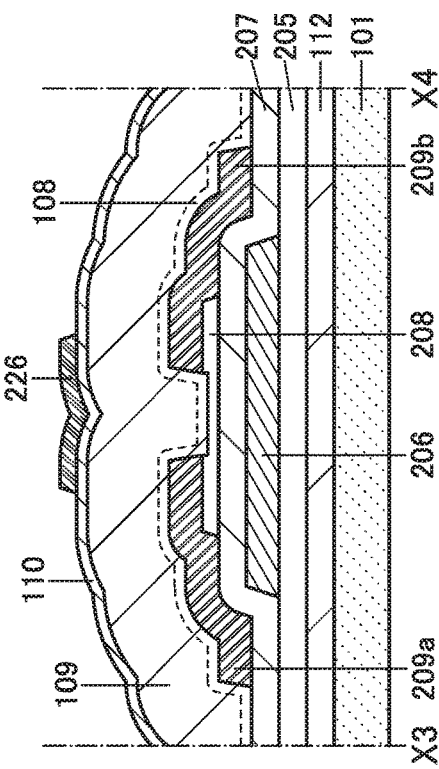

In the transistor 200, the end portion of the gate electrode 206 is located on the outer side of the end portion of the oxide semiconductor film 208 not only in the channel width direction but also in the channel length direction (see FIG. 15B). When the gate electrode 206 is provided such that the end portion of the gate electrode 206 is located on the outer side of the end portion of the oxide semiconductor film 208, a variation in electrical characteristics of the transistor due to light irradiation can be further suppressed.

The structures, methods, and the like described in this embodiment can be used as appropriate in combination with any of the structures, methods, and the like described in other embodiments.

Embodiment 6

In this embodiment, a structure of a transistor 250 which can be used as the transistor 231, the transistor 233, the transistor 431, and the like is described with reference to FIGS. 16A to 16D.

FIG. 16A is a top view of the transistor 250. FIG. 16B is a cross-sectional view of a portion denoted by a dashed-dotted line X5-X6 in FIG. 16A, and FIG. 16C is a cross-sectional view of a portion denoted by a dashed-dotted line Y5-Y6 in FIG. 16A. FIG. 16D is an enlarged view of a portion 290 in FIG. 16B. Note that FIG. 16B illustrates a cross-section in a channel length direction of the transistor 250, and FIG. 16C illustrates a cross-section in a channel width direction of the transistor 250.

The transistor 250 can be manufactured in a manner similar to that of the transistor 431 described in the above embodiment. Note that in the transistor 250, an oxide semiconductor film 218 is formed in contact with the oxide semiconductor film 208. Although the electrode 226 serving as a back gate electrode is not provided in the transistor 250, it is needless to say that the electrode 226 may be provided as necessary.

The oxide semiconductor film 218 is an oxide film containing one or more elements which form the oxide semiconductor film 208. Thus, interface scattering is unlikely to occur at the interface between the oxide semiconductor film 208 and the oxide semiconductor film 218. Thus, the transistor can have a high field-effect mobility because the movement of carriers is not hindered at the interface.

The oxide semiconductor film 218 typically contains In—Ga oxide, In—Zn oxide, or In-M-Zn oxide (M represents Al, Ga, Y, Zr, La, Ce, or Nd). The energy at the conduction band bottom of the oxide semiconductor film 218 is closer to a vacuum level than that of the oxide semiconductor film 208 is, and typically, the difference between the enemy at the conduction band bottom of the oxide semiconductor film 218 and the energy at the conduction band bottom of the oxide semiconductor film 208 is any one of 0.05 eV or more, 0.07 eV or more, 0.1 eV or more, and 0.15 eV or more and any one of 2 eV or less, 1 eV or less, 0.5 eV or less, and 0.4 eV or less. That is, the difference between the electron affinity of the oxide semiconductor film 218 and the electron affinity of the oxide semiconductor film 208 is any one of 0.05 eV or more, 0.07 eV or more, 0.1 eV or more, and 0.15 eV or more and any one of 2 eV or less, 1 eV or less, 0.5 eV or less, and 0.4 eV or less.

The oxide semiconductor film 218 preferably contains In because carrier mobility (electron mobility) can be increased.

When the oxide semiconductor film 218 contains a larger amount of Al, Ga, Y, Zr, La, Ce, or Nd in an atomic ratio than the amount of In in an atomic ratio, any of the following effects may be obtained:

(1) the energy gap of the oxide semiconductor film 218 is widened;

(2) the electron affinity of the oxide semiconductor film 218 decreases;

(3) an impurity from the outside is blocked;

(4) an insulating property increases as compared to the oxide semiconductor film 208; and (5) oxygen vacancies are less likely to be generated in the oxide semiconductor film 218 containing a larger amount of Ga, Y, Zr, La, Ce, or Nd in an atomic ratio than the amount of In in an atomic ratio because Ga, Y, Zr, La, Ce, or Nd is a metal element which is strongly bonded to oxygen.

In the case where the oxide semiconductor film 218 contains an In-M-Zn oxide, the proportions of In and M when summation of In and M is assumed to be 100 atomic % are preferably as follows: the atomic percentage of In is less than 50 atomic % and the atomic percentage of M is greater than or equal to 50 atomic %, or more preferably, the atomic percentage of In is less than 25 atomic % and the atomic percentage of M is greater than or equal to 75 atomic %.

Further, in the case where each of the oxide semiconductor film 208 and the oxide semiconductor film 218 contains an In-M-Zn oxide (M represents Ga, Y, Zr, La, Ce, or Nd), the proportion of M (M represents Ga, Y, Zr, La, Ce, or Nd) in the oxide semiconductor film 218 is higher than that in the oxide semiconductor film 208. Typically, the proportion of M in the oxide semiconductor film 218 is 1.5 or more times, twice or more, or three or more times as high as that in the oxide semiconductor film 208.

Furthermore, in the case where each of the oxide semiconductor film 208 and the oxide semiconductor film 218 contains an In-M-Zn oxide (M represents Al, Ga, Y, Zr, La, Ce, or Nd), when In:M:Zn=$x_1$:$y_1$:$z_1$ [atomic ratio] is satisfied in the oxide semiconductor film 218 and In:M:Zn=$x_2$:$y_2$:$z_2$ [atomic ratio] is satisfied in the oxide semiconductor film 208, $y_1/x_1$ is higher than $y_2/x_2$, or preferably $y_1/x_1$ is 1.5 or more times as high as $y_2/x_2$. More preferably, $y_1/x_1$ is twice or more as high as $y_2/x_2$, or still more preferably $y_1/x_1$ is three or more times as high as $y_2/x_2$. In this case, it is preferable that in an oxide semiconductor film, $y_2$ be higher than or equal to $x_2$ because a transistor including the oxide semiconductor film can have stable electrical characteristics. However, when $y_2$ is larger than or equal to three or more times $x_2$, the field-effect mobility of the transistor including the oxide semiconductor film is reduced. Accordingly, $y_2$ is preferably smaller than three times $x_2$.

In the case where the oxide semiconductor film 208 contains an In-M-Zn oxide (M represents Ga, Y, Zr, La, Ce, or Nd) and a target having the atomic ratio of metal elements of In:M:Zn=$x_1$:$y_1$:$z_1$ is used for forming the oxide semiconductor film 208, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film is easily formed as the oxide semiconductor film 208. Typical examples of the atomic ratio of the metal elements of the target are In:M:Zn=1:1:1, In:M:Zn=5:5:6, In:M:Zn=2:1:2, In:M:Zn=3:1:2, and the like.

In the case where the oxide semiconductor film 218 contains an In-M-Zn oxide (M represents Ga, Y, Zr, La, Ce, or Nd) and a target having the atomic ratio of metal elements of In:M:Zn=$x_2$:$y_2$:$z_2$ is used for forming the oxide semiconductor film 218, $x_2/y_2$ is preferably less than $x_1/y_1$, and $z_2/y_2$ is preferably greater than or equal to 1/3 and less than or equal to 6, further preferably greater than or equal to 1 and less than or equal to 6. Note that when $z_2/y_2$ is greater than or equal to 1 and less than or equal to 6, a CAAC-OS film is easily formed as the oxide semiconductor film 218. Typical examples of the atomic ratio of the metal elements of the target are In:M:Zn=1:3:2, In:M:Zn=1:3:4, In:M:Zn=1:3:6, In:M:Zn=1:3:8, and the like.

Note that the proportion of each metal element in the atomic ratio of each of the oxide semiconductor film 208 and the oxide semiconductor film 218 varies within a range of ±40% of that in the above atomic ratio as an error.

The thickness of the oxide semiconductor film 218 is greater than or equal to 3 nm and less than or equal to 100 nm, preferably greater than or equal to 3 nm and less than or equal to 50 nm.

The oxide semiconductor film 218 may each have a non-single-crystal structure, for example, like the oxide semiconductor film 208. Note that the non-single-crystal structure includes a CAAC structure, a polycrystalline structure, a microcrystalline structure, or an amorphous structure.

The oxide semiconductor film 218 may have an amorphous structure, for example. An amorphous oxide semiconductor film, for example, has disordered atomic arrangement and no crystalline component. Alternatively, the oxide film having an amorphous structure have, for example, an absolutely amorphous structure and no crystal part.

Note that the oxide semiconductor films 208 and 218 may each be a mixed film including two or more of the following: a region having an amorphous structure, a region having a microcrystalline structure, a region having a polycrystalline structure, a region having a CAAC structure, and a region having a single crystal structure. The mixed film includes, for example, two or more of a region having an amorphous structure, a region having a microcrystalline structure, a region having a polycrystalline structure, a region having a CAAC structure, and a region having a single crystal structure in some cases. Further, the mixed film has a layered structure of two or more of a region having an amorphous structure, a region having a microcrystalline structure, a region having a polycrystalline structure, a region having a CAAC structure, and a region having a single crystal structure in some cases.

Here, the oxide semiconductor film 218 is provided between the oxide semiconductor film 208 and the insulating film 108. Hence, if trap states are formed between the oxide semiconductor film 218 and the insulating film 108 owing to impurities and defects, electrons flowing in the oxide semiconductor film 208 are less likely to be captured by the trap states because there is a distance between the trap states and the oxide semiconductor film 208. Accordingly, the amount of on-state current of the transistor can be increased, and the field-effect mobility can be increased. When electrons are captured by the trap states, the electrons become negative fixed charges. As a result, a threshold voltage of the transistor changes. However, by the distance between the oxide semiconductor film 208 and the trap states, capture of the electrons by the trap states can be reduced, and accordingly a change of the threshold voltage can be reduced.

Further, impurities from the outside can be blocked by the oxide semiconductor film 218, and accordingly the amount of impurities which move from the outside to the oxide semiconductor film 208 can be reduced. Further, an oxygen vacancy is less likely to be formed in the oxide semiconductor film 218. Consequently, the impurity concentration and the amount of oxygen vacancies in the oxide semiconductor film 208 can be reduced.

Note that the oxide semiconductor film 208 and the oxide semiconductor film 218 are not formed by simply stacking each film, but are formed to form a continuous junction (here, in particular, a structure in which the energy of the bottom of the conduction band is changed continuously between the films). In other words, a stacked-layer structure in which there exists no impurity which forms a defect level such as a trap center or a recombination center at each interface is provided. If an impurity exists between the oxide semiconductor film 208 and the oxide semiconductor film 218 which are stacked, a continuity of the energy band is damaged, and the carrier is captured or recombined at the interface and then disappears.

In order to form such a continuous junction, it is necessary to form films continuously without being exposed to air, with use of a multi-chamber deposition apparatus (sputtering apparatus) including a load lock chamber. Each chamber of the sputtering apparatus is preferably evacuated to a high vacuum (to the degree of about $5\times10^{-7}$ Pa to $1\times10^{-4}$ Pa) by an adsorption vacuum pump such as a cryopump so that water and the like acting as impurities for the oxide semiconductor film are removed as much as possible. Alternatively, a combination of a turbo molecular pump and a cold trap is preferably used to prevent back-flow of a gas, especially a gas containing carbon or hydrogen, from an exhaust system into a chamber.

In the step of forming the source electrode 209a and the drain electrode 209b, a surface of the oxide semiconductor film 218 may be etched.

[Band Structure Diagram]

Figure 17:
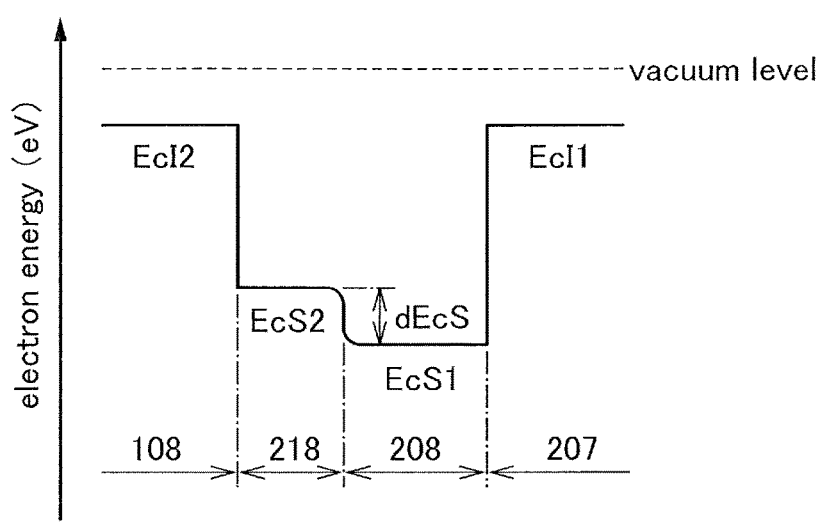
FIG. 17 illustrates a band structure of a transistor.

FIG. 17 is a schematic diagram illustrating a band structure of a portion denoted by a dashed-dotted line Z1-Z2 in FIG. 16D. In FIG. 17, EcI1 denotes the energy of the bottom of the conduction band in the gate insulating film 207; EcS1 denotes the energy of the bottom of the conduction band in the oxide semiconductor film 208; EcS2 denotes the energy of the bottom of the conduction band in the oxide semiconductor film 218; and EcI2 denotes the energy of the bottom of the conduction band in the insulating film 108.

As illustrated in FIG. 17, in the junction portion between the oxide semiconductor films 208 and 218, the conduction band minimums thereof smoothly vary. In other words, the conduction band minimums are continuous. This is because the oxide semiconductor films 208 and 218 contain a common metal element and oxygen is transferred between the oxide semiconductor films 208 and 218, so that a mixed layer is formed.

As shown in FIG. 17, the oxide semiconductor film 208 serves as a well and a channel region is formed in the oxide semiconductor film 208. Note that since the energy of the bottom of the conduction band of the oxide semiconductor films 208 and 218 is continuously changed, it can be said that the oxide semiconductor films 208 and 218 are continuous.

In the step of forming the source electrode 209a and the drain electrode 209b, a surface of the oxide semiconductor film 218 may be etched. Thus, trap states resulting from impurities or defects can be formed in the vicinity of the interface between the oxide semiconductor film 218 and the insulating film 108. However, since the oxide semiconductor film 218 is provided, the oxide semiconductor film 208 can be distanced from the trap states. However, in the case where the energy difference (dEcS) between EcS1 and EcS2 is small, electrons in the oxide semiconductor film 208 may reach the trap level by passing over the energy gap. Since the electron is trapped at the trap level, a negative fixed charge is generated at the interface with the insulating film, causing the threshold voltage of the transistor to be shifted in the positive direction. Therefore, the energy difference (dEcS) between EcS1 and EcS2 is preferably set to be larger than or equal to 0.1 eV, more preferably larger than or equal to 0.15 eV, in which case a change in the threshold voltage of the transistor can be reduced and stable electrical characteristics can be obtained.

The structures, methods, and the like described in this embodiment can be used as appropriate in combination with any of the structures, methods, and the like described in other embodiments.

Embodiment 7

In this embodiment, structure examples of a light-emitting element that can be applied to the light-emitting element 125 are described. Note that an EL layer 320 described in this embodiment corresponds to the EL layer 117 described in the above embodiment.

<Structure of Light-Emitting Element>

Figure 18A:
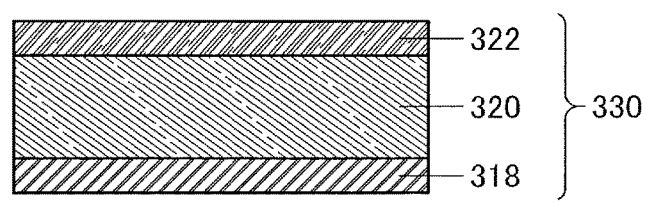
FIGS. 18A and 18B illustrate structure examples of light-emitting elements.

In a light-emitting element 330 illustrated in FIG. 18A, the EL layer 320 is interposed between a pair of electrodes (an electrode 318 and an electrode 322). Note that the electrode 318 is used as an anode and the electrode 322 is used as a cathode as an example in the following description of this embodiment.

The EL layer 320 includes at least a light-emitting layer and may have a stacked-layer structure including a functional layer other than the light-emitting layer. As the functional layer other than the light-emitting layer, a layer containing a substance having a high hole-injection property, a substance having a high hole-transport property, a substance having a high electron-transport property, a substance having a high electron-injection property, a bipolar substance (a substance having high electron- and hole-transport properties), or the like can be used. Specifically, functional layers such as a hole-injection layer, a hole-transport layer, an electron-transport layer, and an electron-injection layer can be used in combination as appropriate.

The light-emitting element 330 illustrated in FIG. 18A emits light when current flows because of a potential difference generated between the electrode 318 and the electrode 322 and holes and electrons are recombined in the EL layer 320. That is, the light-emitting region is formed in the EL layer 320.

In the present invention, light emitted from the light-emitting element 330 is extracted to the outside from the electrode 318 side or the electrode 322 side. Therefore, one of the electrode 318 and the electrode 322 is formed of a light-transmitting substance.

Figure 18B:
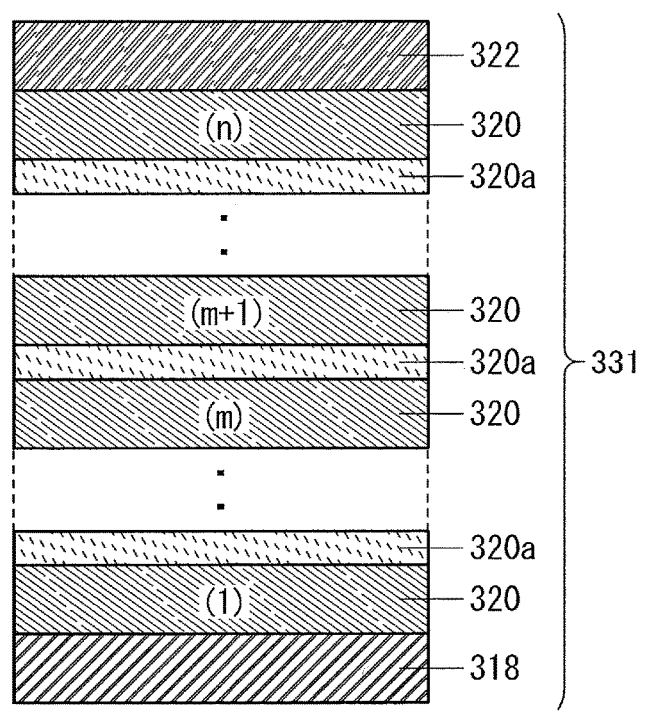

Note that a plurality of EL layers 320 may be stacked between the electrode 318 and the electrode 322 as in a light-emitting element 331 illustrated in FIG. 18B. In the case where n (n is a natural number of 2 or more) layers are stacked, a charge generation layer 320a is preferably provided between an m-th EL layer 320 and an (m+1)-th EL layer 320. Note that m is a natural number greater than or equal to 1 and less than n.

The charge generation layer 320a can be formed using a composite material of an organic compound and a metal oxide, a metal oxide, a composite material of an organic compound and an alkali metal, an alkaline earth metal, or a compound thereof; alternatively, these materials can be combined as appropriate. Examples of the composite material of an organic compound and a metal oxide include composite materials of an organic compound and a metal oxide such as vanadium oxide, molybdenum oxide, and tungsten oxide. As the organic compound, a variety of compounds can be used; for example, low molecular compounds such as an aromatic amine compound, a carbazole derivative, and aromatic hydrocarbon and oligomers, dendrimers, and polymers of these low molecular compounds. As the organic compound, it is preferable to use the organic compound which has a hole-transport property and has a hole mobility of $10^{-6}$ cm$^2$/Vs or higher. However, substances other than the substances given above may also be used as long as the substances have higher hole-transport properties than electron-transport properties. These materials used for the charge generation layer 320a have excellent carrier-injection properties and carrier-transport properties; thus, the light-emitting element 330 can be driven with low current and with low voltage.

Note that the charge generation layer 320a may be formed with a combination of a composite material of an organic compound and a metal oxide with another material. For example, a layer containing a composite material of the organic compound and the metal oxide may be combined with a layer containing a compound of a substance selected from substances with an electron-donating property and a compound with a high electron-transport property. Moreover, a layer containing a composite material of the organic compound and the metal oxide may be combined with a transparent conductive film.

The light-emitting element 331 having such a structure is unlikely to have problems such as energy transfer and quenching and has an expanded choice of materials, and thus can easily have both high emission efficiency and a long lifetime. Moreover, it is easy to obtain phosphorescence from one light-emitting layer and fluorescence from the other light-emitting layer.

The charge generation layer 320a has a function of injecting holes to one of the EL layers 320 that is in contact with the charge generation layer 320a and a function of injecting electrons to the other EL layer 320 that is in contact with the charge generation layer 320a, when voltage is applied between the electrode 318 and the electrode 322.

The light-emitting element 331 illustrated in FIG. 18B can provide a variety of emission colors by changing the type of the light-emitting substance used for the EL layer 320. In addition, a plurality of light-emitting substances emitting light of different colors may be used as the light-emitting substances, whereby light emission having a broad spectrum or white light emission can be obtained.

In the case of obtaining white light emission using the light-emitting element 331 illustrated in FIG. 18B, as for the combination of a plurality of EL layers, a structure for emitting white light including red light, green light, and blue light may be used; for example, the structure may include a light-emitting layer containing a blue fluorescent substance as a light-emitting substance and a light-emitting layer containing red and green phosphorescent substances as light-emitting substances. Alternatively, a structure including a light-emitting layer emitting red light, a light-emitting layer emitting green light, and a light-emitting layer emitting blue light may be employed. Further alternatively, with a structure including light-emitting layers emitting light of complementary colors, white light emission can be obtained. In a stacked-layer element including two light-emitting layers in which light emitted from one of the light-emitting layers and light emitted from the other light-emitting layer have complementary colors to each other, the combinations of colors are as follows: blue and yellow, blue-green and red, and the like.

Note that in the structure of the above-described stacked-layer element, by providing the charge generation layer between the stacked light-emitting layers, the element can have a long lifetime in a high-luminance region while keeping the current density low. In addition, the voltage drop due to the resistance of the electrode material can be reduced, whereby uniform light emission in a large area is possible.

The structures, methods, and the like described in this embodiment can be used as appropriate in combination with any of the structures, methods, and the like described in other embodiments.

Embodiment 8

In this embodiment, examples of an electronic device and a lighting device including the display device of one embodiment of the present invention are described with reference to drawings.

As examples of electronic devices with flexibility, the following can be given: television devices (also called televisions or television receivers), monitors of computers or the like, digital cameras, digital video cameras, digital photo frames, mobile phones (also called cellular phones or mobile phone devices), portable game machines, portable information terminals, audio reproducing devices, large game machines such as pachinko machines, and the like.

In addition, a lighting device or a display device can be incorporated along a curved inside/outside wall surface of a house or a building or a curved interior/exterior surface of a car.

Figure 19A:
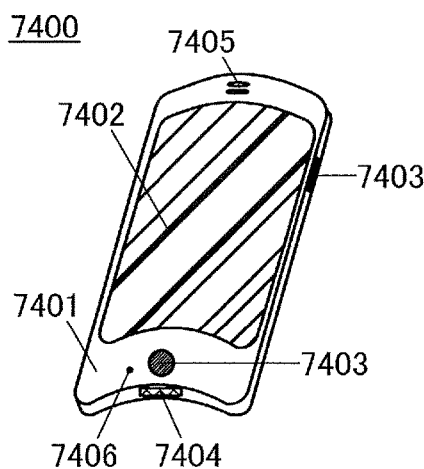
FIGS. 19A to 19E illustrate examples of electronic devices and lighting devices.

FIG. 19A illustrates an example of a mobile phone. A mobile phone 7400 is provided with a display portion 7402 incorporated in a housing 7401, an operation button 7403, an external connection port 7404, a speaker 7405, a microphone 7406, and the like. Note that the mobile phone 7400 is manufactured using the display device in the display portion 7402.

When the display portion 7402 of the mobile phone 7400 illustrated in FIG. 19A is touched with a finger or the like, data can be input to the mobile phone 7400. Further, operations such as making a call and inputting a character can be performed by touch on the display portion 7402 with a finger or the like.

The power can be turned on or off with the operation button 7403. In addition, types of images displayed on the display portion 7402 can be switched; for example, switching images from a mail creation screen to a main menu screen is performed with the operation button 7403.

Here, the display portion 7402 includes the display device of one embodiment of the present invention. Thus, the mobile phone can have a curved display portion and high reliability.

Figure 19B:
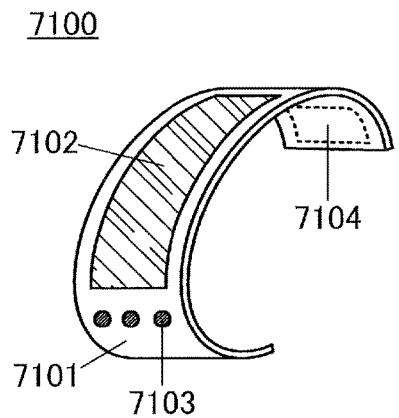

FIG. 19B is an example of a wristband-type display device. A portable display device 7100 includes a housing 7101, a display portion 7102, an operation button 7103, and a sending and receiving device 7104.

The portable display device 7100 can receive a video signal with the sending and receiving device 7104 and can display the received video on the display portion 7102. In addition, with the sending and receiving device 7104, the portable display device 7100 can send an audio signal to another receiving device.

With the operation button 7103, power ON/OFF, switching displayed videos, adjusting volume, and the like can be performed.

Here, the display portion 7102 includes the display device of one embodiment of the present invention. Thus, the portable display device can have a curved display portion and high reliability.

Figure 19C:
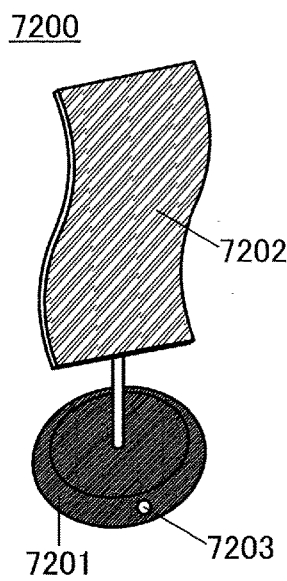
Figure 19D:
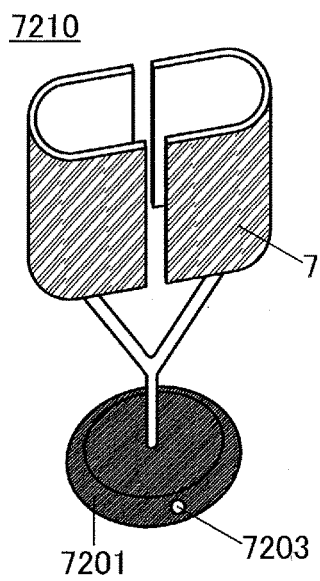
Figure 19E:
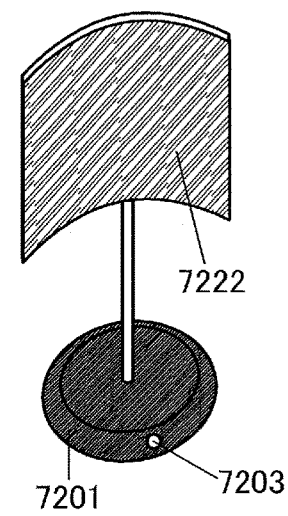

FIGS. 19C to 19E illustrate examples of lighting devices. Lighting devices 7200, 7210, and 7220 each include a stage 7201 provided with an operation switch 7203 and a light-emitting portion supported by the stage 7201.

The lighting device 7200 illustrated in FIG. 19C includes a light-emitting portion 7202 with a wave-shaped light-emitting surface and thus is a good-design lighting device.

A light-emitting portion 7212 included in the lighting device 7210 illustrated in FIG. 19D has two convex-curved light-emitting portions symmetrically placed. Thus, light radiates from the lighting device 7210.

The lighting device 7220 illustrated in FIG. 19E includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 is flexible; thus, the light-emitting portion may be fixed on a plastic member, a movable frame, or the like so that an emission surface of the light-emitting portion can be bent freely depending on the intended use.

The light-emitting portions included in the lighting devices 7200, 7210, and 7220 each include the display device of one embodiment of the present invention. Thus, the lighting devices can have curved display portions and high reliability.

Figure 20A:
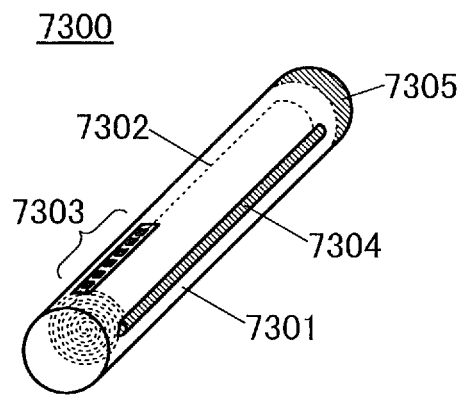
FIGS. 20A and 20B illustrate one example of an electronic device.

FIG. 20A illustrates an example of a portable display device. A display device 7300 includes a housing 7301, a display portion 7302, operation buttons 7303, a display portion pull 7304, and a control portion 7305.

The display device 7300 includes a rolled flexible display portion 7302 in the cylindrical housing 7301.

The display device 7300 can receive a video signal with the control portion 7305 and can display the received video on the display portion 7302. In addition, a battery is included in the control portion 7305. Moreover, a connector may be included in the control portion 7305 so that a video signal or power can be supplied directly.

With the operation buttons 7303, power ON/OFF, switching of displayed videos, and the like can be performed.

Figure 20B:
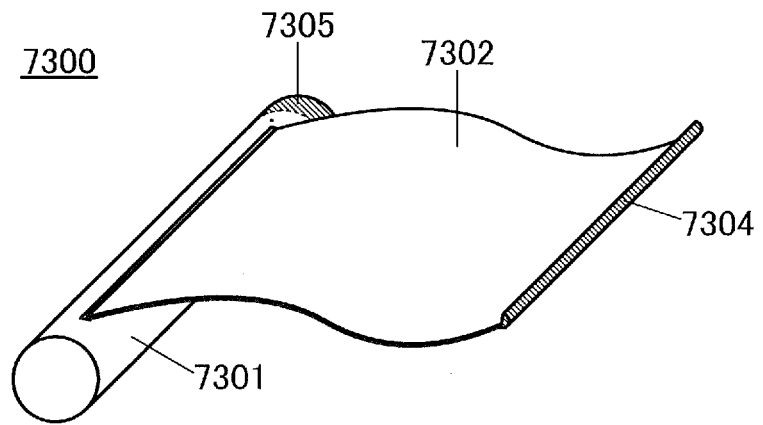

FIG. 20B illustrates a state in which the display portion 7302 is pulled out with the display portion pull 7304. Videos can be displayed on the display portion 7302 in this state. Further, the operation buttons 7303 on the surface of the housing 7301 allow one-handed operation.

Note that a reinforcement frame may be provided for an edge portion of the display portion 7302 in order to prevent the display portion 7302 from being curved when pulled out.

Note that in addition to this structure, a speaker may be provided for the housing so that sound is output with an audio signal received together with a video signal.

The display portion 7302 includes the display device of one embodiment of the present invention. Thus, the display portion 7302 is a flexible, highly reliable display device, which makes the display device 7300 lightweight and highly reliable.

It is needless to say that one embodiment of the present invention is not limited to the above-described electronic devices and lighting devices as long as the display device of one embodiment of the present invention is included.

The structures, methods, and the like described in this embodiment can be used as appropriate in combination with any of the structures, methods, and the like described in other embodiments.

This application is based on Japanese Patent Application serial no. 2013-146046 filed with Japan Patent Office on Jul. 12, 2013, the entire contents of which are hereby incorporated by reference.

What is claimed is:

1. A display device comprising:
a flexible substrate;
a first gate electrode over the flexible substrate;
a first insulating film comprising silicon and oxygen over the first gate electrode;
an oxide semiconductor film over and in contact with the first insulating film, the oxide semiconductor film comprising indium, gallium, and zinc;
a second insulating film over the oxide semiconductor film;
a second gate electrode over the second insulating film, the second gate electrode overlapping with the oxide semiconductor film and the first gate electrode;
a source electrode in contact with the oxide semiconductor film;
a drain electrode in contact with the oxide semiconductor film;
a third insulating film over the second insulating film; and
a capacitor over the flexible substrate, the capacitor comprising:
a first electrode over and in contact with the first insulating film, the first electrode comprising indium, gallium, and zinc;
the third insulating film over and in contact with the first electrode; and
a second electrode over the third insulating film,
wherein the first electrode is electrically connected to one of the source electrode and the drain electrode, and
wherein the first electrode comprises a portion which does not overlap with the second insulating film.

2. The display device according to claim 1, wherein the first electrode comprises hydrogen.

3. The display device according to claim 1, wherein the third insulating film is in contact with a side surface of the second insulating film.

4. The display device according to claim 1, wherein the second insulating film and the third insulating film are over the source electrode and the drain electrode and under the second gate electrode.

5. The display device according to claim 1, wherein the second gate electrode comprises a same element as the second electrode.

6. A display device comprising:
a flexible substrate;
a first gate electrode over the flexible substrate;
a first insulating film comprising silicon and oxygen over the first gate electrode;
an oxide semiconductor film over and in contact with the first insulating film, the oxide semiconductor film comprising indium, gallium, and zinc;
a second insulating film over the oxide semiconductor film;
a second gate electrode over the second insulating film, the second gate electrode overlapping with the oxide semiconductor film and the first gate electrode;
a third insulating film over the second insulating film; and
a capacitor over the flexible substrate, the capacitor comprising:
a first electrode over and in contact with the first insulating film, the first electrode comprising indium, gallium, and zinc;
the third insulating film over and in contact with the first electrode; and
a second electrode over the third insulating film,
wherein the first electrode comprises a portion which does not overlap with the second insulating film, and
wherein a portion of the second electrode is over the second insulating film and the third insulating film.

7. The display device according to claim 6, wherein the first electrode comprises hydrogen.

8. The display device according to claim 6, wherein the third insulating film is in contact with a side surface of the second insulating film.

9. The display device according to claim 6, wherein the second insulating film and the third insulating film are over a source electrode and a drain electrode and under the second gate electrode.

10. The display device according to claim 6, wherein the second gate electrode comprises a same element as the second electrode.

11. A display device comprising:
a flexible substrate;
a first gate electrode over the flexible substrate;
a first insulating film comprising silicon and oxygen over the first gate electrode;
an oxide semiconductor film over and in contact with the first insulating film, the oxide semiconductor film comprising indium, gallium, and zinc;
a second insulating film over the oxide semiconductor film;
a second gate electrode over the second insulating film, the second gate electrode overlapping with the oxide semiconductor film and the first gate electrode;
a source electrode in contact with the oxide semiconductor film;
a drain electrode in contact with the oxide semiconductor film;
a third insulating film over the second insulating film;
a capacitor over the flexible substrate, the capacitor comprising:
a first electrode over and in contact with the first insulating film, the first electrode comprising indium, gallium, and zinc;
the third insulating film over and in contact with the first electrode; and
a second electrode over the third insulating film;
a fourth insulating film over the second gate electrode and the capacitor; and
a light-emitting element over the fourth insulating film, the light-emitting element comprising:
a third electrode comprising a light-transmitting conductive material;
a light emitting layer over the third electrode; and
a fourth electrode over the light emitting layer,
wherein the first electrode is electrically connected to one of the source electrode and the drain electrode, and
wherein the first electrode comprises a portion which does not overlap with the second insulating film.

12. The display device according to claim 11, wherein the first electrode comprises hydrogen.

13. The display device according to claim 11, wherein the third insulating film is in contact with a side surface of the second insulating film.

14. The display device according to claim 11, wherein the second insulating film and the third insulating film are over the source electrode and the drain electrode and under the second gate electrode.

15. The display device according to claim 11, wherein the second gate electrode comprises a same element as the second electrode.

16. The display device according to claim 11, wherein the light-emitting element is configured to emit white light.

17. The display device according to claim 11, further comprising a coloring layer overlapping with the light-emitting element.

* * * * *